United States Patent
Choi et al.

(10) Patent No.: US 9,296,845 B2
(45) Date of Patent: *Mar. 29, 2016

(54) OLEFIN RESIN COMPOSITION

(71) Applicant: LG CHEM, LTD., Seoul (KR)

(72) Inventors: SungHo Choi, Daejeon (KR); Choong Hoon Lee, Daejeon (KR); JiYoon Woo, Daejeon (KR); HyoJu Kim, Daejeon (KR); Jin Sam Gong, Daejeon (KR)

(73) Assignee: LG CHEM, LTD., Seoul (KR)

( * ) Notice: Subject to any disclaimer, the term of this patent is extended or adjusted under 35 U.S.C. 154(b) by 0 days.

This patent is subject to a terminal disclaimer.

(21) Appl. No.: 14/496,833

(22) Filed: Sep. 25, 2014

(65) Prior Publication Data

US 2015/0031812 A1 Jan. 29, 2015

Related U.S. Application Data

(63) Continuation of application No. PCT/KR2013/012118, filed on Dec. 24, 2013.

(30) Foreign Application Priority Data

| Dec. 24, 2012 | (KR) | 10-2012-0151830 |
| Aug. 30, 2013 | (KR) | 10-2013-0104464 |
| Aug. 30, 2013 | (KR) | 10-2013-0104465 |
| Aug. 30, 2013 | (KR) | 10-2013-0104466 |
| Aug. 30, 2013 | (KR) | 10-2013-0104467 |
| Dec. 24, 2013 | (KR) | 10-2013-0162471 |

(51) Int. Cl.

| C08C 19/25 | (2006.01) |
| C08F 210/16 | (2006.01) |
| C08L 51/00 | (2006.01) |
| C08K 5/132 | (2006.01) |
| C08K 5/134 | (2006.01) |
| C08K 5/52 | (2006.01) |
| C08L 23/08 | (2006.01) |
| H01L 31/048 | (2014.01) |
| C08L 23/00 | (2006.01) |
| C08F 255/02 | (2006.01) |
| C08F 8/42 | (2006.01) |
| C08L 51/06 | (2006.01) |
| H01L 23/29 | (2006.01) |
| C08K 5/544 | (2006.01) |

(52) U.S. Cl.
CPC ............. *C08F 210/16* (2013.01); *C08F 8/42* (2013.01); *C08F 255/02* (2013.01); *C08K 5/132* (2013.01); *C08K 5/1345* (2013.01); *C08K 5/52* (2013.01); *C08L 23/00* (2013.01); *C08L 23/08* (2013.01); *C08L 23/0815* (2013.01); *C08L 51/003* (2013.01); *C08L 51/06* (2013.01); *H01L 23/296* (2013.01); *H01L 31/0481* (2013.01); *C08K 5/544* (2013.01); *C08L 2203/204* (2013.01); *C08L 2203/206* (2013.01); *C08L 2205/025* (2013.01); *Y02E 10/50* (2013.01)

(58) Field of Classification Search
CPC .. C08L 51/003; C08K 5/5415; H01L 31/0481
USPC .......................................................... 525/342
See application file for complete search history.

(56) References Cited

U.S. PATENT DOCUMENTS

| 2012/0048354 A1 | 3/2012 | Sato et al. |
| 2012/0073631 A1* | 3/2012 | Ikenaga et al. ............ 136/251 |

FOREIGN PATENT DOCUMENTS

| JP | 2012-214555 A | 11/2012 |
| KR | 10-2010-0123505 A | 11/2010 |
| KR | 10-2012-0023077 A | 3/2012 |
| KR | 10-2012-0024690 A | 3/2012 |
| KR | 2012-190942 A | 10/2012 |

* cited by examiner

*Primary Examiner* — Kuo-Liang Peng
(74) *Attorney, Agent, or Firm* — Dentons US LLP

(57) ABSTRACT

Provided is an olefin resin composition, and a method of manufacturing an encapsulant for an optoelectronic device, in which the encapsulant exhibits excellent adhesive strength with a back sheet and a front substrate included in various optoelectronic devices. In addition, the encapsulant does not have a bad influence on parts such as optoelectronic units or wiring electrodes encapsulated in an optoelectronic device, and a working environment, and can excellently maintain workability and economic feasibility of device manufacturing.

14 Claims, 4 Drawing Sheets

OLEFIN RESIN COMPOSITION

This application is a Continuation Bypass Application of International Patent Application No. PCT/KR2013/012118, filed on Dec. 24, 2013, and claims the benefit of Korean Patent Application Nos. 10-2012-0151830, filed on Dec. 24, 2012, 10-2013-0104465, filed on Aug. 30, 2013, 10-2013-0104466, filed on Aug. 30, 2013, 10-2013-0104467, filed on Aug. 30, 2013, 10-2013-0104464, filed on Aug. 30, 2013 and 10-2013-0162471, filed on Dec. 24, 2013 in the Korean Intellectual Property Office, all of which are incorporated herein by reference in their entirety.

TECHNICAL FIELD

The present application relates to an olefin resin composition and a method of manufacturing an encapsulant for an optoelectronic device.

BACKGROUND ART

An optoelectronic device such as a photovoltaic cell, a light emitting diode (LED), or an organic light emitting diode (organic LED) may include an encapsulant encapsulating an optical emission region or optical sensing region of a device.

For example, a solar cell module may be generally manufactured by a lamination method including laminating a transparent front substrate that is a light-receiving substrate, an encapsulant, a photovoltaic element, an encapsulant, and a back sheet, and then hot-pressing the laminate thus laminated while vacuum-aspirating the laminate.

As an encapsulant used for a solar cell module, an ethylene-vinyl acetate (EVA) resin is most often used in view of processability, buildability, costs, and the like.

However, the EVA resin has low adhesive strength with respect to an element, such as a front substrate or a back sheet, which is in contact with an encapsulant included in an optoelectronic device. Therefore, when the module is exposed outdoors for a long period of time, there is a problem in that interlayer peeling is easily likely to occur. In addition, during manufacturing a solar cell module using an encapsulant including an EVA resin, the EVA resin may be subject to a pyrolysis according to a hot-pressing condition, and thereby, acetic acid gas may be generated. The acetic acid gas aggravates a working environment, has a bad influence on a photovoltaic element or electrode included in a solar cell module, and also causes deterioration of the module, decline of generating efficiency, and the like.

Therefore, a demand for an encapsulant for an optoelectronic device having an improved long-term adhesive property has lasted.

DISCLOSURE

Technical Problem

Embodiments of the present application are directed to providing an olefin resin composition and a method of manufacturing an encapsulant for an optoelectronic device.

Technical Solution

An embodiment of the present application provides an olefin resin composition, in which by the olefin resin composition, an encapsulant for an optoelectronic device having excellent adhesive strength with respect to a substrate may be manufactured.

In the present specification, "a modified olefin resin" and "modified ethylene/α-olefin copolymer" mean a copolymer including a moiety, in which hydrocarbon groups in some silyl groups of the olefin resin grafted with an unsaturated silane compound are converted into hydroxyl groups, and also a moiety including an amine functional group, and are used in the same meaning as an copolymer including a branched chain represented by Chemical Formula 3 to be described below. In order to distinguish from the modified olefin resin or modified ethylene/α-olefin copolymer described above, the ethylene/α-olefin copolymer grafted only with an unsaturated silane compound without an amino silane compound is defined as "a silane-modified olefin resin" or "silane-modified ethylene/α-olefin copolymer".

The olefin resin composition according to an embodiment of the present application includes an olefin resin, an unsaturated silane compound, an amino silane compound, and a radical initiator.

The olefin resin is not particularly limited as long as it may be classified into olefin, but examples thereof include a homopolymer or copolymer of at least one olefin-based monomer selected from α-olefins, such as ethylene, propylene, isobutylene, 1-butene, 1-pentene, 1-hexene, 1-heptene, 1-octene, 1-nonene, 1-decene, 4-phenyl-1-butene, 6-phenyl-1-hexene, 2-methyl-1-butene, 3-methyl-1-butene, 4-methyl-1-butene, 3-methyl-1-pentene, 4-methyl-1-hexene, 5-methyl-1-hexene, 3,3-dimethyl-1-pentene, 3,4-dimethyl-1-pentene, 4,4-dimethyl-1-pentene, or vinylcyclohexane; dienes, such as 1,3-butadiene, 1,4-butadiene, and 1,5-hexadiene; halogen-substituted α-olefins, such as hexafluoropropene, tetrafluoroethylene, 2-fluoropropene, fluoroethylene, 1,1-difluoroethylene, 3-fluoropropene, trifluoroethylene, or 3,4-dichloro-1-butene; and cyclic olefins, such as cyclopentene, cyclohexene, norbornene, 5-methyl norbornene, 5-ethyl norbornene, 5-propyl norbornene, 5,6-dimethyl norbornene, or 5-benzyl norbornene.

In addition, the olefin resin includes all of the polymers having different types of the arrangement even if the polymers are prepared from the monomer(s) having the same compositions. For example, in the embodiments of the present application, in order to properly adjust viscosity or physical properties of the resin composition according to use, the arrangement of copolymer included in the olefin resin may be adjusted in a random type, a crossing type, a block type, different segments, or the like, and then the olefin resin may be used.

In the embodiments of the present application, the olefin resin may be an ethylene/α-olefin copolymer, ethylene polymer, propylene polymer, or ethylene-vinylacetate copolymer, and in an embodiment, the olefin resin may be the ethylene/α-olefin copolymer.

The "ethylene/α-olefin copolymer" means polyolefin including a polymerized type of ethylene and α-olefin as a main component, and particularly, not only a homopolymer of ethylene, but also a copolymer including at least 50 mol % or more of ethylene as a polymerization unit and an olefin monomer having 3 or more of carbon atoms or other comonomers as a polymerization unit.

The ethylene/α-olefin copolymer may be, for example, one or two or more selected from the group consisting of a low-density ethylene/α-olefin copolymer, intermediate-density ethylene/α-olefin copolymer, high-density ethylene/α-olefin copolymer, ultra-low-density ethylene/α-olefin copolymer, hyper-ultra-low-density ethylene/α-olefin copolymer, and linear low-density ethylene/α-olefin copolymer.

The ethylene/α-olefin copolymer having many side chains generally has low density, and the ethylene/α-olefin copolymer having few side chains generally has high density. In addition, as the number of the side chains increases, grafting efficiency becomes high. Therefore, in an embodiment of the present application, a low-density ethylene/α-olefin copolymer having many side chains may be used as the olefin resin grafted with an unsaturated silane compound and amino silane, and thereby, grafting efficiency becomes high. Therefore, adhesive strength of an encapsulant may be improved.

Accordingly, in the embodiments of the present application, particularly, an ethylene/α-olefin copolymer having the density of about 0.85 g/cm³ to 0.96 g/cm³, for example, the density of about 0.85 g/cm³ to 0.92 g/cm³, 0.86 g/cm³ to 0.91 g/cm³, 0.87 g/cm³ to 0.90 g/cm³, 0.88 g/cm³ to 0.91 g/cm³, or 0.87 g/cm³ to 0.905 g/cm³ may be used, but the present invention is not limited thereto.

In addition, a melt flow rate (MFR) of the ethylene/α-olefin copolymer may be about 1.0 g/10 min to about 50.0 g/10 min, about 1.0 g/10 min to 30.0 g/10 min, about 1.0 g/10 min to about 10.0 g/10 min, about 1.0 g/10 min to 8.0 g/10 min, or about 3.0 g/10 min to 7.0 g/10 min under a temperature of 190° C. and a load of 2.16 kg. In the case of having the MFR in such a range, for example, the olefin resin has a low molecular weight, and thereby an olefin resin composition may have excellent moldability. The MFR (melt flow rate) may be measured under a temperature of 190° C. and a load of 2.16 kg, for example, in the case of ethylene/α-olefin copolymer, but the present invention is not limited thereto.

The unsaturated silane compound included in the olefin resin composition is an unsaturated silane compound represented by the following Chemical Formula 1, and may be included in a type of being polymerized into a modified olefin resin or silane-modified olefin resin by being grafted into a main chain including a polymerization unit of olefin-based monomer for the olefin resin under presence of a radical initiator. In other words, the olefin resin composition of the present application may provide a graft polymer, in which an olefin resin is grafted with an unsaturated silane compound represented by the following Chemical Formula 1.

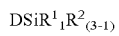  [Chemical Formula 1]

In the Chemical Formula 1, D represents alkenyl being bound to a silicon atom. The alkenyl means a functional group having at least one or more unsaturated groups, for example, double bonds, and a carbon number of the alkenyl may be 2 to 20, 2 to 12, or 2 to 6. For the alkenyl, the above-described D may be, for example, vinyl, allyl, propenyl, isopropenyl, butenyl, hexenyl, cyclohexenyl, or γ-methacryloxypropyl, and as an example, may be vinyl.

$R^1$ may represent a hydroxyl group, halogen, amine group, or —$R^3R^4$, each being bound to a silicon atom, $R^3$ may represent oxygen or a sulfur atom, $R^4$ may represent an alkyl group, an aryl group, or acyl group, and $R^2$ may represent hydrogen, an alkyl group, an aryl group, or an aralkyl group, each being bound to a silicon atom.

As an example, the $R^1$ may be a reactive functional group capable of being hydrolyzed by access of water existed in a system, and examples thereof may include an alkoxy group, an alkylthio group, an aryloxy group, an acyloxy group, a halogen group, or an amine group. In this case, examples of the alkoxy group may include an alkoxy group of 1 to 20 carbon atoms, 1 to 12 carbon atoms, 1 to 8 carbon atoms, or 1 to 4 carbon atoms, examples of the acyloxy group may include an acyloxy group of 1 to 12 carbon atoms, 1 to 8 carbon atoms, or 1 to 4 carbon atoms, and examples of the alkylthio group may include an alkylthio group of 1 to 12 carbon atoms, 1 to 8 carbon atoms, or 1 to 4 carbon atoms.

In addition, in an embodiment, $R^1$ in the Chemical Formula 1 may be an alkoxy group, and particularly, an alkoxy group of 1 to 12 carbon atoms or 1 to 8 carbon atoms. In other embodiments, $R^1$ in the Chemical Formula 1 may be an alkoxy group of 1 to 4 carbon atoms, for example, a methoxy group, an ethoxy group, a propoxy group, an isopropoxy group, or a butoxy group. For example, in some embodiments, a methoxy group or an ethoxy group may be used.

In addition, the $R^2$ may be an un-reactive functional group, and examples of the $R^2$ may include hydrogen, an alkyl group, an aryl group, or aralkyl group. In this case, examples of the alkyl group may include an alkyl group of 1 to 12 carbon atoms, 1 to 8 carbon atoms, or 1 to 4 carbon atoms. In addition, the aryl group may be an aryl group of 6 to 18 carbon atoms or 6 to 12 carbon atoms, and for example, a phenyl group. The aralkyl group may be an aralkyl group of 7 to 19 carbon atoms or 7 to 13 carbon atoms, and for example, a benzyl group.

In addition, in the Chemical Formula 1, 1 may be an integer of 1 to 3, and in some embodiments, it may be 3.

Specific examples of the unsaturated silane compound in the above-described Chemical Formula 1 may include vinyl alkoxy silane. Examples of the unsaturated silane compound may include vinyl trimethoxy silane, vinyl triethoxy silane, vinyl tripropoxy silane, vinyl triisopropoxy silane, vinyl tributoxy silane, vinyl tripentoxy silane, vinyl triphenoxy silane, or vinyl triacetoxy silane, and as an example, among them, vinyl trimethoxy silane or vinyl triethoxy silane may be used, but the present invention is not limited thereto.

As an example, the olefin resin composition may include the unsaturated silane compound represented by the above-described Chemical Formula 1 in an amount of 0.1 part by weight to 10.0 parts by weight, 0.5 part by weight to 7.0 parts by weight, 1.0 part by weight to 5.5 parts by weight, or 0.5 part by weight to 5.0 parts by weight with respect to 100 parts by weight of a solid content in the whole olefin resin composition. In such a range, the adhesive property of the copolymer, for example, the adhesive property to a glass substrate, a back sheet, and the like may be excellently maintained.

Unless otherwise specified, in the present specification, a unit part by weight means a weight ratio.

In an example, the olefin resin composition includes an amino silane compound. The amino silane compound may act as a catalyst catalyzing a hydrolysis reaction that converts a reactive functional group such as an alkoxy group of an unsaturated silane compound grafted into the olefin resin into a hydroxyl group in a grafting modifying process of an olefin resin, for example, ethylene/α-olefin copolymer, and thereby, may allow adhesive strength to a back sheet constituted of a fluoride resin or top and bottom glass substrate to be further improved. In addition, at the same time, the amino silane compound may be directly involved as a reactant in a copolymerization reaction, and thus, may provide a moiety having an amine functional group to a new copolymer of the present application to be described below.

The amino silane compound may be a compound represented by the following Chemical Formula 2.

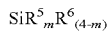  [Chemical Formula 2]

In the Chemical Formula 2, $R^5$ represents —$(CH_2)_nNR^7R^8$ being bound to a silicon atom, $R^7$ and $R^8$ each independently represent hydrogen or $R^9NH_2$, each being bound to a nitrogen atom, and $R^9$ represents alkylene of 1 to 6 carbon atoms.

In addition, $R^6$ represents halogen, an amine group, —$R^{10}R^{11}$, or —$R^{11}$ being bound to a silicon atom, $R^{10}$ represents oxygen or a sulfur atom, and R represents hydrogen, an alkyl group, an aryl group, an aralkyl group, or an acyl group.

In this case, the above-described m is an integer of 1 to 4, and n is an integer of 0 or more.

In this case, an alkyl group, an aryl group, an aralkyl group, an acyl group, and alkylene are the same as described above, and thus, the explanation about them will not be provided.

Preferably, in the Chemical Formula 2, $R^6$ may represent —$R^{10}R^{11}$ being bound to a silicon atom, $R^{10}$ may represent an oxygen atom, $R^{11}$ may represent hydrogen, an alkyl group, an aryl group, an aralkyl group, or an acyl group, $R^5$ may represent —$(CH_2)_n NR^7R^8$ being bound to a silicon atom, $R^7$ and $R^8$ may represent hydrogen, or $R^7$ may represent hydrogen and $R^8$ may represent $R^9NH^2$, and in this case, $R^9$ may represent alkylene of 1 to 3 carbon atoms. In addition, in this case, n may be an integer of 2 to 5.

The amino silane compound may be added in a process of modifying an olefin resin, that is, a process of manufacturing a modified olefin resin.

In addition, the amino silane compound does not adversely affect other components included in the composition, for example, a UV stabilizer, and the like to be described below, and may allow overall physical properties of the composition to be stably maintained in the way they intended.

The amino silane compound that can be used for the embodiments of the present application is not particularly limited as long as it is a silane compound having an amine group, and primary and secondary amine. For example, amino trialkoxysilane, amino dialkoxysilane, and the like may be used as the amino silane compound, and examples of the amino silane compound may include at least one selected from the group consisting of 3-aminopropyltrimethoxysilane (APTMS), 3-aminopropyltriethoxysilane (APTES), bis[(3-triethoxysilyl)propyl]amine, bis[(3-trimethoxysilyl)propyl] amine, 3-aminopropylmethyldiethoxysilane, 3-aminopropylmethyldimethoxysilane, N-[3-(trimethoxysilyl)propyl] ethylenediamine (DAS), aminoethylaminopropyltriethoxysilane, aminoethylaminopropylmethyldimethoxysilane, aminoethylaminopropylmethyldiethoxysilane, aminoethylaminomethyltriethoxysilane, aminoethylaminomethylmethyldiethoxysilane, diethylenetriaminopropyltrimethoxysilane, diethylenetriaminopropyltriethoxysilane, diethylenetriaminopropylmethyldimethoxysilane, diethyleneaminomethylmethyldiethoxysilane, (N-phenylamino)methyltrimethoxysilane, (N-phenylamino)methyltriethoxysilane, (N-phenylamino)methylmethyldimethoxysilane, (N-phenylamino)methylmethyldiethoxysilane, 3-(N-phenylamino)propyltrimethoxysilane, 3-(N-phenylamino)propyltriethoxysilane, 3-(N-phenylamino)propylmethyldimethoxysilane, 3-(N-phenylamino)propylmethyldiethoxysilane, and N—(N-butyl)-3-aminopropyltrimethoxysilane. The amino silane compound may be used singly or in combination.

The amino silane compound may be included in an amount of 0.01 to 2.0 parts by weight with respect to 100 parts by weight of a solid content in the whole olefin resin composition, and may be included in an amount of 0.01 to 0.5 part by weight, 0.1 to 0.25 part by weight, 0.2 to 0.5 part by weight, 0.5 to 1.25 parts by weight, 0.1 to 1.5 parts by weight, or 0.2 to 2.0 parts by weight with respect to 100 parts by weight of a solid content in the whole olefin resin composition. In such a weight ratio, the physical properties of the resin composition may be effectively adjusted, the adhesive strength to the above-described front substrate and back sheet may be increased, and the activities of other additives that are included in the resin composition may be excellently maintained. When the content of the amino silane compound added is too large, discoloration of the resin is likely to occur early and gel is plentifully formed during the process. For this reason, the appearance of the sheet to be manufactured may be negatively influenced.

The amino silane compound may be included in a content of 1 to 35 parts by weight, for example, 2 to 6 parts by weight, 2 to 5.5 parts by weight, 5 to 5.5 parts by weight, 2 to 15 parts by weight, 5 to 15 parts by weight, 10 to 35 parts by weight, 5 to 35 parts by weight, 15 to 33.3 parts by weight, or 2 to 33.3 parts by weight with respect to 100 parts by weight of the unsaturated silane compound in the whole olefin resin composition, and also the amino silane compound may be included in a content of 1 to 40 parts by weight, for example, 2 to 30 parts by weight, 2 to 25 parts by weight, 1 to 25 parts by weight, 2 to 6 parts by weight, 1 to 10 parts by weight, 4 to 12 parts by weight, 5 to 10 parts by weight, 2 to 10 parts by weight, or 2 to 5 parts by weight with respect to 100 parts by weight of the silane compound in the whole olefin resin composition. When the olefin resin composition having the amino silane compound in such a content range is reactive-extruded, the adhesive strength between an encapsulant for an optoelectronic device thus manufactured and a front substrate becomes excellent. On the other hand, when the amino silane compound is excessively included, the yellowness index of the encapsulant thus manufactured becomes high, and thereby other physical properties of the encapsulant may be influenced.

The amino silane compound and the unsaturated silane compound are similar in terms of including a silyl group, but are different from each other in terms of including an amine functional group and an unsaturated group, respectively. The olefin resin composition includes both two materials, and in this case, the olefin resin composition may provide excellent adhesive performance as compared with the case of including only one material among two materials. In this case, as the amino silane compound is added, the adhesive performance may be definitely improved regardless of the content of the unsaturated silane compound, but even in the case of using the unsaturated silane compound having the same content condition, when the amino silane compound is added, the adhesive performance may be further improved.

Furthermore, according to the embodiments of the present application, as compared with the case of manufacturing an encapsulant only using alkyl silane and alkyl amine, the encapsulant having excellent adhesive performance may be provided. For example, in the case of using only alkyl amine, since unlike a vinyl silane or amino silane compound, the alkyl amine is not engaged in a grafting polymerization reaction, and remained as a material left in a system, the alkyl amine is moved into a surface of the modified olefin resin to be formed, or moved into a surface of a sheet at the time of manufacturing it as an encapsulant sheet. Therefore, long-term durability is likely to be decreased due to the materials left in a system. Furthermore, in the case of some alkyl amines, because the alkyl amines has a melting point of about 27 to 29° C., there are problems that the alkyl amines has low miscibility with other reactive materials, for example, a liquid silane compound in a temperature range of 27 to 29° C. or less.

As an example, the olefin resin composition includes a radical initiator. The radical initiator may function as initiating the grafting reaction of unsaturated silane compound to the olefin resin.

The radical initiator is not particularly limited as long as it can initiate the radical polymerization of a vinyl group. Examples thereof may include one or two or more selected from the group consisting of organic peroxide, hydroperoxide, or an azo compound. Specifically, the examples thereof may include at least one selected from the group consisting of dialkyl peroxides such as t-butylcumylperoxide, di-t-butyl peroxide, di-cumyl peroxide, 2,5-dimethyl-2,5-di(t-butylperoxy)hexane, and 2,5-dimethyl-2,5-di(t-butylperoxy)-3-hexine; hydroperoxides such as cumene hydroperoxide, diisopropyl benzene hydroperoxide, 2,5-dimethyl-2,5-di(hydroperoxy)hexane, and t-butylhydroperoxide; diacylperoxides such as bis-3,5,5-trimethylhexanoyl peroxide, octanoylperoxide, benzoyl peroxide, o-methylbenzoyl peroxide, and 2,4-dichlorobenzoyl peroxide; peroxy esters such as t-butylperoxy isobutyrate, t-butylperoxy acetate, t-butylperoxy-2-ethylhexanoate, t-butylperoxy pyvarate, t-butylperoxy octoate, t-butylperoxy isopropyl carbonate, t-butylperoxy benzoate, di-t-butylperoxy phthalate, 2,5-dimethyl-2,5-di(benzoylperoxy)hexane, and 2,5-dimethyl-2,5-di(benzoylperoxy)-3-hexine; ketone peroxides such as methylethylketone peroxide and cyclohexanone peroxide; and azo compounds such as lauryl peroxide, azobisisobutyronitrile, and azobis(2,4-dimethylvaleronitrile), but the present invention is not limited thereto.

The radical initiator described above may be included in an amount of 0.001 parts by weight to 5 parts by weight with respect to 100 parts by weight of a solid content in the whole olefin resin composition.

The olefin resin composition according to the embodiments of the present application may further include at least one additive selected from the group consisting of a photostabilizer, a UV absorbent, and thermal stabilizer, if necessary.

The photostabilizer may function as preventing photooxidation by catching active species of photo-induced degradation initiation of the olefin resin according to the use applied with the composition. A type of photostabilizer capable of being used may be, but is not particularly limited, for example, the known compounds such as a hindered amine-based compound or hindered piperidine-based compound.

The UV absorbent may function as preventing the excitation of active species of photo-induced degradation initiation in the olefin resin by absorbing UV from sunlight and then converting into thermal energy that is harmless to a molecule, according to the use of the composition. A specific type of UV absorbent capable of being used may be, but is not particularly limited, for example, the mixture of one or two or more of benzophenone-based, benzotriazole-based, acryl nitrile-based, metallic complex salt-based, hindered amine-based, and an inorganic-based UV absorbent, such as ultrafine titanium dioxide or ultrafine zinc oxide.

In addition, examples of the thermal stabilizer may include phosphorous-based thermal stabilizer such as tris(2,4-di-tert-butylphenyl)phosphite, bis[2,4-bis(1,1-dimethylethyl)-6-methylphenyl]ethylester phosphorous acid, tetrakis(2,4-di-tert-butylphenyl)[1,1-biphenyl]-4,4'-diylbisphosphonate, and bis(2,4-di-tert-butylphenyl)pentaerythritol diphosphite; and lactone-based thermal stabilizer such as a reaction product of 8-hydroxy-5,7-di-tert-butyl-furan-2-one and o-xylene, and among them, one or two or more thermal stabilizers may be used.

In the olefin resin composition, the contents of the photostabilizer, UV absorbent, and/or thermal stabilizer are not particularly limited. In other words, the content of the additive may be properly selected in the light of the use of the resin composition, the shape of the additive, the density of the additive, and the like, and generally, may be properly adjusted in a range of 0.01 part by weight to 5 parts by weight with respect to 100 parts by weight of the whole solid content of the resin composition.

In addition, the exemplified olefin resin composition may further include properly various additives that are known in the related art according to the use applied with the resin component in addition to the above-described components.

Another embodiment of the present application provides a method of manufacturing an encapsulant for an optoelectronic device using the olefin resin composition described above. As an example, the method of manufacturing an encapsulant for an optoelectronic device includes preparing a modified olefin resin.

The method of preparing a modified olefin resin may be prepared by, but is not particularly limited to, for example, adding the olefin resin composition including an olefin resin, an unsaturated silane compound, and an amino silane compound to a reactor, mixing them in the reactor, and then subjecting them to the grafting extrusion reaction through a heat melting under presence of a proper radical initiator.

A type of the reactor for preparing the modified olefin resin is not particularly limited as long as it can prepare a desired resin by reacting heat-melted or liquid reactants. For example, the reactor may be an extruder or an extruder including a hopper. In the case of using such a reactor, the modified olefin resin may be also prepared, for example, by adding a liquid unsaturated silane compound, amino silane compound, and radical initiator to a heat-melted olefin resin that is heat-melted through an extruder, and then extrusion-processing them, or mixing a olefin resin, a radical initiator, an amino silane compound, and an unsaturated silane compound in a hopper, adding the mixture to the extruder, and then reacting them in the extruder through heat-melting.

Other additives such as a UV absorbent, thermal stabilizer, or a UV stabilizer may be added to the modified olefin resin thus prepared, and may be added to the reactor before forming the modified olefin resin or after forming the modified olefin resin. As an example, the process may be simplified by performing the preparing of the modified olefin resin and the mixing with the additives in one reactor at the same time.

In this case, other additives may be added as it is in the reactor, or may be added in a type of a master batch and then mixed in the reactor. In this case, the master batch means a raw material in a shape of pellet prepared by concentrating the additives to be added in a high concentration, and then dispersing them. The master batch may be generally used to add additives having a specific function to a completed product for processing and molding a plastic raw material using the method such as an extrusion or injection molding.

In this case, a method of adding additives to a reactor forming a modified olefin resin may be, but is not particularly limited to, for example, a method of adding an additive in a type of a master batch through a side feeder installed at a proper site of an extruder or cylinder, or a method of adding an additive after being mixed with a olefin resin and the like in a hopper.

In the above-described method, a specific type and design of the reactor, the conditions such as heat-melting, mixing, or reaction temperatures and times, and a method of preparing a master batch are not particularly limited, and may be properly adjusted in the light of raw materials used, and the like.

In the embodiments of the present application, the olefin resin composition according to the present application may be molded in a film or sheet shape thereby preparing an encapsulant for an optoelectronic device. In the molding method described above, an encapsulant may be prepared by forming a sheet or film with a general process such as a T-die process or extrusion, for example, but the present invention is not particularly limited. The embodiments of the present application may be performed in an in situ process using a device, which is connected between a filming or sheeting process and a preparing process of a modified olefin resin using the above-described olefin resin composition.

According to the present application, a copolymer, that is, a modified olefin resin to be described below may be provided according to the above-described preparing method using the olefin resin composition. The copolymer may be included in an encapsulant for an optoelectronic device, for example. The copolymer may be used as an encapsulant encapsulating an element in various optoelectronic devices but the present invention is not limited thereto, and for example, may be used as an industrial material applied in a temperature rising lamination process.

As an example, the copolymer includes a main chain including a polymerization unit of olefin-based monomer; and a branched chain represented by the following Chemical Formula 3, which is bound to the main chain.

$$—SiR^{12}{}_oR^{13}{}_{(2-o)}R^{14} \quad \text{[Chemical Formula 3]}$$

In the Chemical Formula 3, $R^{12}$ and $R^{13}$ each independently represent halogen, an amine group, $—R^{15}R^{16}$, or $—R^{16}$, being bound to a silicon atom, $R^{15}$ represents oxygen or a sulfur atom, $R^{16}$ represents hydrogen, an alkyl group, an aryl group, an aralkyl group, or an acyl group, and o is an integer of 1 or 2.

$R^{14}$ represents $—OSiR^{17}{}_pR^{18}{}_{(2-p)}R^{19}$ being bound to a silicon atom, $R^{17}$ and $R^{18}$ each independently represent halogen, an amine group, $—R^{20}R^{21}$ or $—R^{21}$, being bound to a silicon atom, $R^{20}$ represents oxygen or a sulfur atom, and $R^{21}$ represents hydrogen, an alkyl group, an aryl group, an aralkyl group, or acyl group, $R^{19}$ represents $—(CH_2)_qNR^{22}R^{23}$ being bound to a silicon atom, $R^{22}$ and $R^{23}$ each independently represent hydrogen or $R^{24}NH_2$, being bound to a nitrogen atom, and $R^{24}$ represents alkylene, the p is an integer of 1 or 2, and q is an integer of 0 or more.

The copolymer includes a branched chain represented by the above-described Chemical Formula 3, in which the branched chain is grafted to a main chain including a polymerization unit of olefin-based monomer, for example. The branched chain may have the structure including a moiety, in which hydrocarbon groups of some silyl groups are converted into hydroxyl groups, and also a moiety having an amine functional group. The copolymer includes a moiety having converted hydroxyl group and also amine functional group, and thus, hydrogen bonds are formed between the amine functional groups and hydroxyl groups of the surface of the glass substrate of the bottom of the encapsulant in an optoelectronic device, for example, thereby providing excellent adhesive strength. In addition, lots of hydrogen bonds may be formed with a back sheet constituted of a fluorine resin of top of the encapsulant, thereby providing excellent adhesive strength.

As an example, the carbon number of the alkyl group in the above-described Chemical Formula 3 may be 1 to 20, 1 to 12, 1 to 8, or 1 to 4, and for example, a methyl group, an ethyl group, a propyl group, or a butyl group, but the present invention is not limited thereto.

In addition, the carbon number of the aryl group may be 6 to 20, 6 to 18, or 6 to 12, and for example, a phenyl group or a naphthyl group, but the present invention is not limited thereto.

The aralkyl group means an alkyl group, in which at least one of hydrogen atoms of a hydrocarbon group of the alkyl group is substituted by an aryl radical, and a carbon number of the aralkyl group may be 7 to 40, 7 to 19, or 7 to 13. A carbon number of the aralkyl group means the total number of carbon atoms included in the alkyl group and aryl radical.

A carbon number of the alkylene group may be a linear or branched alkylene group of 1 to 16 carbon atoms, 1 to 12 carbon atoms, 1 to 6 carbon atoms, or 1 to 4 carbon atoms, and examples thereof may include an ethylene group or propylene group, but the present invention is not limited thereto.

In addition, the acyl group is a functional group that is expressed as RC=O, and the R represents an alkyl group or aryl group, and examples thereof may include formyl, acetyl, propionyl, or benzoyl, but the present invention is not limited thereto. The carbon number of the alkyl group and aryl group included in the acyl group is the same as described above.

As an example, at least one of the $R^{12}$ and $R^{13}$ may be a reactive functional group capable of being hydrolyzed by the access of water existed in a system, and the explanation about them is the same as the reactive functional group described above, and thus will not be provided.

In addition, the $R^{12}$ or $R^{13}$ may be a non-reactive functional group, and the explanation about them is the same as the non-reactive functional group described above, and thus will not be provided.

In this case, $R^{14}$ is a functional group including a moiety having converted into the hydroxyl group described above and also a moiety having an amine functional group, and for this reason, the copolymer of the present application has a hydrogen bond between an amine functional group and a hydroxyl group of the surface of the glass substrate of the bottom of the encapsulant in an optoelectronic device as described above, thereby providing excellent adhesive strength, and also has lots of hydrogen bonds with a back sheet constituted of a fluorine resin of the top of the encapsulant, thereby providing excellent adhesive strength.

In addition, in the above-described Chemical Formula 3, o is an integer of 1 or 2, and in some embodiments, it may be 2.

As an example, preferably, in the above-described Chemical Formula 3, $R^{12}$ and $R^{13}$ may each independently represent a hydroxyl group or $—R^{15}R^{16}$, being bound to a silicon atom, $R^5$ may represent oxygen, $R^{16}$ may represent an alkyl group, $R^{14}$ may represent $—OSiR^{17}{}_pR^{18}{}_{(2-p)}R^{19}$ being bound to a silicon atom, $R^{17}$ and $R^{18}$ may each independently represent a hydroxyl group or $—R^{20}R^{21}$ being bound to a silicon atom, $R^{20}$ may represent oxygen, $R^{21}$ may represent an alkyl group, $R^{19}$ may represent $—(CH_2)_qNR^{22}R^{23}$ being bound to a silicon atom, $R^{22}$ and $R^{23}$ may each independently represent hydrogen or $R^{24}NH_2$, being bound to a nitrogen atom, and $R^{24}$ may represent alkylene.

In addition, more preferably, in the above-described Chemical Formula 3, $R^{12}$ and $R^{13}$ may represent a hydroxyl group, $R^{14}$ may represent $—OSiR^{17}{}_pR^{8}{}_{(2-p)}R^{19}$ being bound to a silicon atom, $R^{17}$ and $R^{18}$ may represent a hydroxyl group, $R^{19}$ may represent $—(CH_2)_qNR^{22}R^{23}$ being bound to a silicon atom, $R^{22}$ may represent hydrogen, $R^{23}$ may represent $R^{24}NH_2$, and $R^{24}$ may represent alkylene.

In this case, the alkyl group and alkylene are the same as described above.

In addition, in an example, the copolymer may further include a branched chain represented by the following Chemical Formula 4, which is bound to a main chain.

$$—SiR^{25}{}_rR^{26}{}_{(3-r)} \quad \text{[Chemical Formula 4]}$$

In the Chemical Formula 4, $R^{25}$ and $R^{26}$ each independently represent halogen, an amine group, —$R^{27}R^{28}$, or —$R^{28}$, being bound to a silicon atom, $R^{27}$ represents oxygen or a sulfur atom, $R^{28}$ represents hydrogen, an alkyl group, an aryl group, an aralkyl group, or an acyl group, and r is an integer of 1 to 3.

Preferably, in the above-described Chemical Formula 4, $R^{25}$ and $R^{26}$ may each independently represent a hydroxyl group or —$R^{27}R^{28}$, being bound to a silicon atom, $R^{27}$ may represent oxygen, and $R^{28}$ may represent an alkyl group.

As described above, the copolymer of the present application includes a moiety having converted into a hydroxyl group and also an amine functional group, and thus, the rate that some hydrocarbon groups of the silyl group are converted into a hydroxyl group may greatly increase as compared with the copolymer only having the branched chain represented by the above-described Chemical Formula 4, for example, the copolymer, in which only an unsaturated silane compound having a vinyl group is copolymerized to the olefin resin. For this reason, when the copolymer is included in the encapsulant for an optoelectronic device, as compared with the copolymer including only a branched chain represented by Chemical Formula 4, more hydrogen bonds between an amine functional group and a hydroxyl group of the surface of the glass substrate of the bottom of the encapsulant are formed, and thus, excellent adhesive strength may be provided. In addition, more hydrogen bonds with the back sheet constituted of a fluorine resin of the top of the encapsulant are formed, and thus, excellent adhesive strength may be provided.

In addition, according to the method of manufacturing an encapsulant for an optoelectronic device described above using the olefin resin composition of the present application, the encapsulant for an optoelectronic device including the copolymer may be provided.

In an example, the encapsulant for an optoelectronic device includes a modified olefin resin prepared by performing a grafting extrusion reaction of the olefin resin composition according to the present application, that is, the above-described copolymer. As described above, the copolymer is formed by grafting an amino silane compound represented by the above-described Chemical Formula 2 and an unsaturated silane compound represented by the above-described Chemical Formula 1 to a main chain including a polymerization unit of an olefin-based monomer. By including a branched chain represented by the above-described Chemical Formula 3, the copolymer includes both of a moiety (A), in which the hydrocarbon groups of some silyl groups are converted into hydroxyl groups, and a moiety (B) introduced with a terminal amine functional group. The ratio of the silane-modified moiety (A) and silane-modified moiety (B) introduced with an amine group may be 99:1 to 40:60.

In an example, the degree of the conversion of methoxysilyl group (Si—O—$CH_3$) into a silanol group (Si—OH), which is performed by promoting hydrolysis by an amino silane compound during a lamination process of the encapsulant, a moiety (A), in which the hydrocarbon groups of some silyl groups included in the copolymer in a polymerization type are converted into hydroxyl groups, and a moiety (B) introduced with a terminal amine functional group, may be measured by an FT-IR analysis.

For example, for the copolymer, as measured by the FT-IR using an ATR method, a ratio $S_a/S_m$ of a peak area ($S_a$) of an silanol group (Si—OH) and an amine group ($NH_2$) at the region of the wave number of 3100 $cm^{-1}$ to 3600 $cm^{-1}$ with respect to a peak area ($S_m$) of a methylene group ($CH_2$) at the region of the wave number of 705 $cm^{-1}$ to 735 $cm^{-1}$ may be 1.5 or more, for example, 2.0 or more, 2.5 or more, 2.85 or more, 3.5 or more, 5.0 or more, 5.25 or more, 6.0 or more, 6.5 or more, or 7.0 or more. The upper limit of the peak area ratio $S_a/S_m$ of the copolymer is not particularly limited, but for example, the area ratio $S_a/S_m$ may be 10.0 or less, 9.0 or less, or 8.0 or less. The peak area ($S_a$) of the silanol group (Si—OH) and amine group ($NH_2$) of the copolymer as measured by the FT-IR may be increased according to the content of the amino silane compound.

In addition, for the encapsulant, as measured by the FT-IR using the ATR method, a ratio $S_a/S_m$ of a peak area ($S_a$) of an silanol group (Si—OH) and an amine group ($NH_2$) at the region of the wave number of 3100 $cm^{-1}$ to 3600 $cm^{-1}$ with respect to a peak area ($S_m$) of a methylene group ($CH_2$) at the region of the wave number of 705 $cm^{-1}$ to 735 $cm^{-1}$ may be 0.6 or more, for example, 0.7 or more, 0.8 or more, 0.9 or more, 1.0 or more, 1.1 or more, 1.2 or more, 1.25 or more, 1.5 or more, or 2.0 or more. The upper limit of the peak area ratio $S_a/S_m$ of the encapsulant film is not particularly limited, but for example, the area ratio $S_a/S_m$ may be 10.0 or less, 9.0 or less, 8.0 or less, 6.0 or less, 5.0 or less, or 4.0 or less. Like the copolymer, the peak area ($S_a$) of the silanol group (Si—OH) and amine group ($NH_2$) of the encapsulant as measured by the FT-IR may be increased according to the content of the amino silane compound.

The above-described ATR method (attenuated total reflection absorption spectroscopy) means a spectrophotometry using an absorption phenomenon of reflected light by only a part of samples nearby contact surface while total reflection occurs when incident light is irradiated at the side of a transparent material by contacting between the samples (solid or liquid) and the transparent material having a high refractive index such as quartz. In the FT-IR measuring method of the present application, the transparent material may be diamond/ZnSe, an incidence angle of light may be 45°, and a value of the peak may be a value measured by reflecting 32 times.

As an example, the peak area of the silanol group (Si—OH) and amine group ($NH_2$) and the peak area of the methylene group may be calculated by measuring an absorption rate of infrared rays at the region of the wave number of 600 $cm^{-1}$ to 4000 $cm^{-1}$ with an FT-IR apparatus, and then measuring each area of the peaks using it. For example, the peak area of the silanol group (Si—OH) and amino group ($NH_2$) may be calculated by integrating the peak area from the wave number of 3100 $cm^{-1}$ to the wave number of 3600 $cm^{-1}$ using the wave number from 2400 $cm^{-1}$ to 3800 $cm^{-1}$ as the base line, and the peak area of the methylene group ($CH_2$) may be calculated by integrating the peak region from the wave number of 705 $cm^{-1}$ to the wave number of 735 $cm^{-1}$ using the wave number of 690 $cm^{-1}$ to the wave number of 760 $cm^{-1}$ as the base line. In this case, the wave number means an inverse number (1/λ) of the wavelength of infrared rays irradiated.

As an example, the encapsulant according to the present application has excellent adhesive strength to a front substrate, for example, a glass substrate even if the encapsulant is laminated at a low lamination temperature by including the above-described copolymer. The peel strength of the encapsulant for an optoelectronic device to the glass substrate, which is measured at a peel angle of 90° and a peel rate of 50 mm/min after performing the lamination at a temperature of 110° C. or higher, for example, 110° C., 130° C., 140° C., 150° C., or 160° C., may be 50 N/15 mm or more, 60 N/15 mm or more, 70 N/15 mm or more, 80 N/15 mm or more, 90 N/15 mm or more, 100 N/15 mm or more, 110 N/15 mm or more, 60 N/15 mm or more, 120 N/15 mm or more, 130 N/15 mm or more, 140 N/15 mm or more, 150 N/15 mm or more, 160 N/15 mm or more, 165 N/15 mm or more, 170 N/15 mm or more, 180 N/15 mm or more, or 200 N/15 mm or more.

As the lamination temperature increases, the adhesive strength between the encapsulant and glass substrate increases. For example, the relationship between the peel strength of the encapsulant and the lamination temperature of the glass substrate and the encapsulant satisfies the relation formula as the following Equation 1. In other words, the encapsulant of the present application may satisfy the following Equation 1, for example.

$$P=\alpha_1(T_L-100)+\beta_1 \quad \text{[Equation 1]}$$

In the above-described Equation 1, P represents peel strength of the encapsulant to the glass substrate, which is measured at a peel angle of 90° and a peel rate of 50 mm/min, $T_L$ represents a lamination temperature of the encapsulant and glass substrate, $\alpha_1$ is 1 or more, and $\beta_1$ is 40 or more.

Preferably, in the above-described Equation 1, $\alpha_1$ is 1.5 to 4 and $\beta_1$ is 50 to 150, and more preferably, $\alpha_1$ is 2.5 to 3.3 and $\beta_1$ is 70 to 130.

In the above-described Equation 1, the lamination temperature of the encapsulant and glass substrate may be a temperature of 100° C. or higher, for example, 110° C., 120° C., 130° C., 140° C., 150° C., 160° C., or 170° C., and also the lamination may be performed for 15 minutes and 30 seconds, for example, for 5 minutes in a vacuum, 30 seconds in a pressure condition, and 10 minutes in a remaining pressure condition.

The encapsulant of the present application satisfies the above-described Equation 1, and thus, even in the case of laminating at a temperature of 100° C. or higher, specifically, at a low temperature, that is, about 110° C., the encapsulant has excellent adhesive strength to the glass substrate. In addition, as the lamination temperature increases, the increasing amount of the adhesive strength becomes high, and thus, it has an advantage that it may be excellently applied for the lamination process of various conditions, productivity may be increased, and thus, production costs may be reduced.

In addition, the encapsulant of the present application may have a yellowness index (hereinafter, referred to as YI) value of 0.5 to 2.5, for example, 0.5 to 1.0, 0.5 to 1.5, 1.0 to 1.5, 1.25 to 1.5, or 1.25 to 2.5. As the YI value is low, an optoelectronic device may have excellent generating efficiency.

The above-described yellowness index is a value obtained by the quantification of a yellowing phenomenon of the encapsulant when being exposed to ultraviolet rays, and may be measured by using a UV/Vis spectrometer based on ASTM D1925. For example, using the UV/Vis spectrometer, the reflectivity of the encapsulant at a wavelength region of 400 nm to 700 nm is measured, and then using the reflectivity, the yellowness index value may be calculated based on the following Equation 2.

$$YI=[100(1.28X_{CIE}-1.06Z_{CIE})]/Y_{CIE} \quad \text{[Equation 2]}$$

In the Equation 2, YI is a value calculated by using a chrominance analysis program of a UV/VIS/NIR spectrometer, and $X_{CIE}$, $Y_{CIE}$, and $Z_{CIE}$ are relative values represented by red, green, and blue color coordinates, respectively.

In addition, the encapsulant of the present application has excellent light transmittance. For example, the total light transmittance value of the encapsulant is 90.0% or more, for example, 91.0% or more, 91.2% or more, 91.3% or more, 91.5% or more, 91.7% or more, 91.9% or more, or 92.1% or more, and may be adjusted to have the total light transmittance in the above-described range in the light of the photoelectric efficiency of an optoelectronic device.

In addition, the encapsulant has a low haze value, and thus, exhibits excellent transparency. For example, the haze value of the encapsulant is 4.0% or less, for example, 3.5% or less, 3.0% or less, 2.5% or less, 2.0% or less, or 1.5% or less, and may be adjusted to have the above-described range of the haze value in the light of the photoelectric efficiency of an optoelectronic device.

The total light transmittance and haze may be a value measured with a haze meter with respect to the light of the wavelength of 200 nm or more, for example, 300 nm, 350 nm, 400 nm, 450 nm, 500 nm, 550 nm, or 600 nm, and preferably, may be a value measured with a haze meter with respect to the light of the wavelength of 550 nm. In addition, for example, the total light transmittance and haze may be a value measured after being laminated on a glass substrate at a temperature of 110° C., 130° C., or 150° C., but the present invention is not limited thereto.

In addition, the total light transmittance may be measured by using a UV/Vis spectroscopy. In this case, the total light transmittance may be a value measured by using a UV/Vis spectroscopy with respect to the light of the wavelength of 200 nm or more, for example, 200 nm to 1300 nm, 250 to 1300 nm, or 300 to 1100 nm.

The encapsulant for an optoelectronic device may include a non-modified olefin resin in addition to the modified olefin resin. A specific type of the non-modified olefin resin that can be used is not particularly limited. For example, as the non-modified olefin resin, polyethylene may be used, and specifically, an ethylene/α-olefin copolymer, which falls into the same category as the ethylene/α-olefin copolymer used at the time of preparing the modified olefin resin described above, may be used.

The content ratio of the non-modified olefin resin and modified olefin resin may be 1:1 to 20:1, for example, 1:1 to 10:1, 1:1 to 5:1, or 2:1 to 5:1. When the non-modified olefin resin is too much, it is easy to decrease adhesive performance expressed by the modified olefin resin. On the other hand, when the non-modified olefin resin is too little, the adhesive performance expressed in the modified olefin resin is early expressed, and thus processability is decreased and gel and the like are generated, and thereby sheet moldability may be undesired.

The content of the non-modified olefin resin may be selected in the light of the desired physical property, but the present invention is not particularly limited thereto. For example, the non-modified olefin resin may be included in a range of 0.01 part by weight to 3000 parts by weight, 100 parts by weight to 2000 parts by weight, or 90 parts by weight to 1000 parts by weight with respect to 100 parts by weight of the modified olefin resin.

The encapsulant may be included in a state of uniformly mixing respective components as they are, or may be included in a state of being molded by various molding methods, such as a hot melting extrusion and a T-die molding.

A shape of the encapsulant may be, but is not particularly limited to, for example, a sheet or film shape. In this case, a thickness of the encapsulant may be adjusted to about 10 μm to 2,000 μm, or about 100 μm to 1250 μm in consideration of the light of support efficiency and breakage possibility of an element, weight lightening of a device, workability, and the like. However, the thickness of the encapsulant may be changed according to the specific use to be applied.

According to the present application, an optoelectronic device including an optoelectronic element encapsulated by an encapsulant prepared from the above-described olefin resin composition may be provided.

The encapsulated optoelectronic element may be, for example, an optical emission region or an optical sensing region such as a photoelectric cell, a light emitting diode, or an organic light emitting diode.

A specific structure of the optoelectronic device or a method of encapsulating an optoelectronic element using the olefin resin composition according to the embodiments of the present application are not particularly limited, and may be applied to achieve a purpose according to a corresponding device.

For example, when the optoelectronic device is a photoelectric cell, as illustrated in FIG. 1 or 2, the optoelectronic device may be a solar cell module including front substrates 11 and 21, back sheets 12 and 22, and photovoltaic element 13 and 23 encapsulated by an encapsulants 14a, 14b, and 24 between the front substrates 11 and 21 and the back sheets 12 and 22. In this case, the encapsulants may be prepared from the olefin resin composition according to the embodiments of the present application.

The solar cell module described above may be manufactured by a general molding method such as a lamination method including laminating a front substrate, an encapsulant, a photovoltaic element, and a back sheet according to a desired structure, and then, integrally hot-pressing the laminate thus laminated while the laminate is vacuum-aspirated. In this case, the process conditions of the lamination method are not particularly limited, and the lamination method may be generally performed at a temperature of 90° C. to 230° C. or 110° C. to 200° C. for 1 minute to 30 minutes or 1 minute to 10 minutes.

In the case of the olefin resin composition according to the embodiments of the present application, the hydrolysis of the reactive silyl group, for example, a methoxysilyl group (Si—O—$CH_3$), of the silane-modified moiety of the modified olefin resin that becomes chemically unstable through an extrusion process is accelerated by an amino silane compound in a modularization process such as the lamination described above, and thus, the reactive silyl group is converted into a silanol group (Si—OH). In addition, the silanol group is chemically and covalently bound to a residue such as a hydroxyl group on the surface of the front substrate of the optoelectronic device by dehydration condensation, thereby expressing high adhesive strength.

Furthermore, hydrogen bonds are formed between the fluorine and the silanol group even on the interface with the back sheet having a surface layer including a fluoropolymer that is well-used lately, and thus, unlike the conventional encapsulant, high interface adhesive strength may be exhibited. In addition, the sites that are non-covalently bound with fluorine by the moiety having an amine functional group introduced by a small amount of an amino silane compound increases, and thus, high adhesive strength may be provided.

In this case, specific types of the front substrate, back sheet, and photovoltaic element that can be used are not particularly limited. For example, the front substrate may be a general plate glass; or a transparent complex sheet manufactured by laminating a glass, a fluorine-based resin sheet, a weathering film, and a barrier film, and the back sheet may be a complex sheet manufactured by laminating a metal such as aluminum, a fluorine-based resin sheet, a weathering film, and a barrier film, and has a surface layer including a fluoropolymer. For example, it may be a multilayer film with a fluoropolymer layer formed on both sides of a polyethylene terephthalate (PET) film. In addition, the photovoltaic element may be, for example, a silicon wafer-based active layer or a thin film active layer formed by chemical vapor deposition (CVD), and the like.

Advantageous Effects

The embodiments of the present application can provide an encapsulant having excellent adhesive strength to a front substrate and a back sheet included in various optoelectronic devices, especially, having improved long-term adhesive property and thermal resistance. In addition, the encapsulant does not have a bad influence on parts such as optoelectronic elements or wiring electrodes encapsulated in an optoelectronic device, and a working environment, and can excellently maintain workability and economic feasibility of device manufacturing.

MODES OF THE INVENTION

Figure 1:
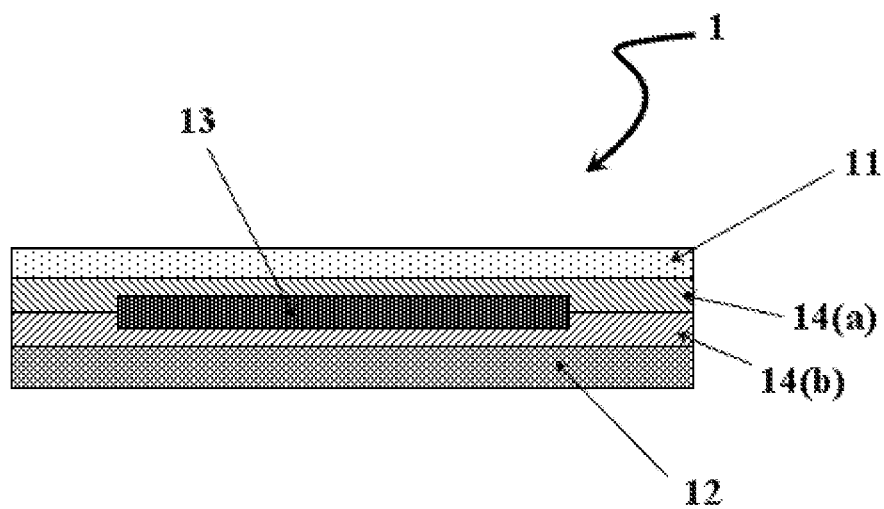
FIGS. 1 and 2 are cross-sectional diagrams illustrating a solar cell module that is an optoelectronic device according to one example of the present application.
Figure 2:
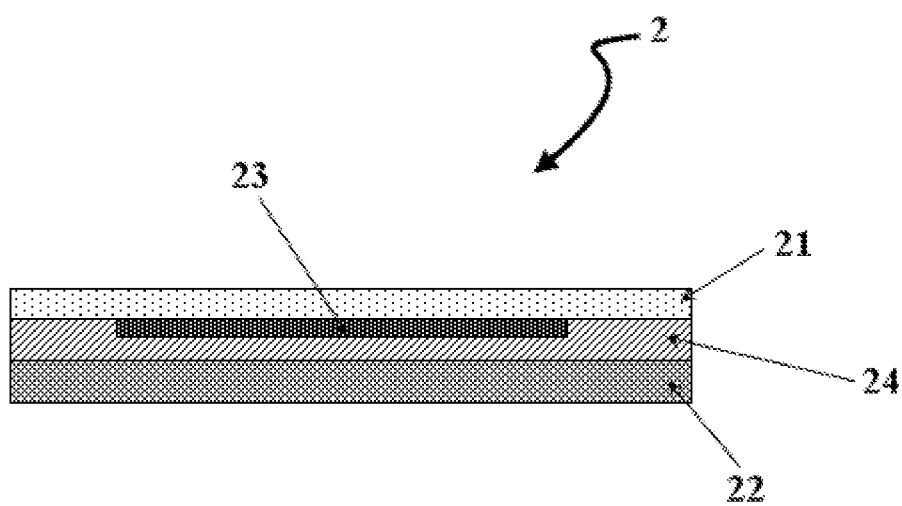

Hereinafter, the present application will be described in more detail with reference to Examples and Comparative Examples of the present application, but the scope of the present application is not limited to Examples to be described below.

Preparation of Modified Ethylene/α-Olefin Copolymer

Preparation Example 1

95.01 parts by weight of ethylene/α-olefin copolymer having a density of 0.870 g/cm$^3$ and an MFR of 5 g/10 min under a temperature of 190° C. and a load of 2.16 kg, 4.79 parts by weight of vinyltrimethoxysilane (VTMS), 0.1 part by weight of 3-aminopropyltrimethoxysilane (APTMS), and 0.1 part by weight of 2,5-bis(tert-butylperoxy)-2,5-dimethylhexane (Luperox® 101) were subjected to a grafting reaction extrusion (hot melting stirring) at a temperature of 220° C. and 180 rpm using a twin-screw extruder to prepare a master batch of modified ethylene/α-olefin copolymer (each of the part by weight represents wt % with respect to total 100 parts by weight).

Preparation Examples 2, 3, and 10

The master batches of modified ethylene/α-olefin copolymers were prepared in the same method as Preparation Example 1 except that the contents of the vinyltrimethoxysilane and 3-aminopropyltrimethoxysilane used in Preparation Example 1 were changed as listed in the following Table 1.

Preparation Examples 4 and 5

The master batches of modified ethylene/α-olefin copolymers were prepared in the same method as Preparation Example 3 except that 3-aminopropyltriethoxysilane (APTES) and N-[3-(trimethoxysilyl)propyl]ethylenediamine (DAS) were respectively used instead of 3-aminopropyltrimethoxysilane used in Preparation Example 3.

Preparation Examples 6 and 7

The master batches of modified ethylene/α-olefin copolymers were prepared in the same methods as Preparation Examples 1 and 3, respectively, except that ethylene/α-olefin copolymers having a density of 0.882 g/cm$^3$ and an MFR of 3 g/10 min under a temperature of 190° C. and a load of 2.16 kg were used instead of the ethylene/α-olefin copolymer used in Preparation Examples 1 and 3, respectively.

Preparation Examples 8 and 9

The master batches of modified ethylene/α-olefin copolymers were prepared in the same methods as Preparation Examples 1 and 3, respectively, except that ethylene/α-olefin copolymers having a density of 0.902 g/cm$^3$ and an MFR of 3 g/10 min under a temperature of 190° C. and a load of 2.16 kg were used instead of the ethylene/α-olefin copolymer used in Preparation Examples 1 and 3, respectively.

Comparative Preparation Example 1

The master batch of silane-modified ethylene/α-olefin copolymer was prepared in the same method as Preparation Example 1 except that the 3-aminopropyltrimethoxysilane used in Preparation Example 1 was not used, but 4.89 parts by weight of vinyltrimethoxysilane was used.

Comparative Preparation Examples 2 and 3

The master batches of silane-modified ethylene/α-olefin copolymers were prepared in the same method as Preparation Example 3 except that dodecylamine (DA) and trimethoxypropylsilane (TMS) were respectively used instead of the 3-aminopropyltrimethoxysilane used in Preparation Example 3.

Comparative Preparation Example 4

The master batch of silane-modified ethylene/α-olefin copolymer was prepared in the same method as Comparative Preparation Example 1 except that an ethylene/α-olefin copolymer having a density of 0.882 g/cm$^3$ and an MFR of 3 g/10 min under a temperature of 190° C. and a load of 2.16 kg was used instead of the ethylene/α-olefin copolymer used in Comparative Preparation Example 1.

Comparative Preparation Example 5

The master batch of silane-modified ethylene/α-olefin copolymer was prepared in the same method as Comparative Preparation Example 1 except that an ethylene/α-olefin copolymer having a density of 0.902 g/cm$^3$ and an MFR of 3 g/10 min under a temperature of 190° C. and a load of 2.16 kg was used instead of the ethylene/α-olefin copolymer used in Comparative Preparation Example 1.

Comparative Preparation Examples 6 and 7

The master batches of ethylene/α-olefin copolymers were prepared in the same method as Preparation Example 1 except that 4.89 parts by weight and 0.49 part by weight of 3-aminopropyltrimethoxysilane were respectively used instead of the vinyltrimethoxysilane used in Preparation Example 1.

Comparative Preparation Example 8

The master batch of modified ethylene/α-olefin copolymer was prepared in the same method as Preparation Example 1 except that 2.44 parts by weight of the vinyltrimethoxysilane and 2.45 parts by weight of the 3-aminopropyltrimethoxysilane were used instead of 4.79 parts by weight of the vinyltrimethoxysilane and 0.1 part by weight of the 3-aminopropyltrimethoxysilane used in Preparation Example 1.

TABLE 1

| | Base resin (content, density) | VTMS (content) | Luperox ® 101 (content) | Amino silane (content) | Amino silane content (based on total silane) |
|---|---|---|---|---|---|
| Preparation Example 1 | 95.01 wt % (d = 0.870) | 4.79 wt % | 0.1 wt % | APTMS 0.1 wt % | 2 wt % |
| Preparation Example 2 | 95.01 wt % (d = 0.870) | 4.65 wt % | 0.1 wt % | APTMS 0.24 wt % | 5 wt % |
| Preparation Example 3 | 95.01 wt % (d = 0.870) | 4.40 wt % | 0.1 wt % | APTMS 0.49 wt % | 10 wt % |
| Preparation Example 4 | 95.01 wt % (d = 0.870) | 4.40 wt % | 0.1 wt % | APTES 0.49 wt % | 10 wt % |
| Preparation Example 5 | 95.01 wt % (d = 0.870) | 4.40 wt % | 0.1 wt % | DAS 0.49 wt % | 10 wt % |
| Preparation Example 6 | 95.01 wt % (d = 0.882) | 4.79 wt % | 0.1 wt % | APTMS 0.1 wt % | 2 wt % |
| Preparation Example 7 | 95.01 wt % (d = 0.882) | 4.40 wt % | 0.1 wt % | APTMS 0.49 wt % | 10 wt % |
| Preparation Example 8 | 95.01 wt % (d = 0.902) | 4.79 wt % | 0.1 wt % | APTMS 0.1 wt % | 2 wt % |
| Preparation Example 9 | 95.01 wt % (d = 0.902) | 4.40 wt % | 0.1 wt % | APTMS 0.49 wt % | 10 wt % |
| Preparation Example 10 | 95.01 wt % (d = 0.870) | 3.67 wt % | 0.1 wt % | APTMS 1.22 wt % | 25 wt % |

TABLE 1-continued

| | Base resin (content, density) | VTMS (content) | Luperox ® 101 (content) | Amino silane (content) | Amino silane content (based on total silane) |
|---|---|---|---|---|---|
| Comparative Preparation Example 1 | 95.01 wt % (d = 0.870) | 4.89 wt % | 0.1 wt % | — | — |
| Comparative Preparation Example 2 | 95.01 wt % (d = 0.870) | 4.40 wt % | 0.1 wt % | DA 0.49 wt % | — |
| Comparative Preparation Example 3 | 95.01 wt % (d = 0.870) | 4.40 wt % | 0.1 wt % | TMS 0.49 wt % | — |
| Comparative Preparation Example 4 | 95.01 wt % (d = 0.882) | 4.89 wt % | 0.1 wt % | — | — |
| Comparative Preparation Example 5 | 95.01 wt % (d = 0.902) | 4.89 wt % | 0.1 wt % | — | — |
| Comparative Preparation Example 6 | 95.01 wt % (d = 0.870) | — | 0.1 wt % | APTMS 4.89 wt % | 100 wt % |
| Comparative Preparation Example 7 | 95.01 wt % (d = 0.870) | — | 0.1 wt % | APTMS 0.49 wt % | 100 wt % |
| Comparative Preparation Example 8 | 95.01 wt % (d = 0.870) | 2.44 wt % | 0.1 wt % | APTMS 2.45 wt % | 50 wt % |

VTMS: vinyltrimethoxysilane
APTMS: 3-aminopropyltrimethoxysilane
APTES: 3-aminopropyltriethoxysilane
DAS: N-[3-(trimethoxysilyl)propyl]ethylenediamine
DA: dodecylamine
TMS: trimethoxypropylsilane Manufacturing of Encapsulant and Solar Cell Module Examples 1 to 5

200 g of each of the master batches of the modified ethylene/α-olefin copolymers prepared from Preparation Examples 1 to 5 and 400 g of each of the ethylene/α-olefin copolymers having a density of 0.870 g/cm³ and an MFR of 5 g/10 min under a temperature of 190° C. and a load of 2.16 kg were prepared, and then were mixed in a ratio of 1:2 to prepare a resin. The resin thus obtained was mixed with 18 g of the additive master batch that was prepared to include 1000 ppm of a photostabilizer (Uvinul 5050H), 1000 ppm of a UV absorbent (TINUVIN UV531), 500 ppm of an antioxidant 1 (Irganox 1010), and 500 ppm of an antioxidant 2 (Irgafos 168) in a final sheet, and then, the mixture thus obtained was added into a twin-screw extruder (4 of 19 mm) and a hopper of a film molding machine having T-dices (a width of 200 mm), and processed at an extrusion temperature of 180° C. and a purge rate of 3 m/min to prepare an encapsulant in a sheet shape having a thickness of about 500 μm.

A plate glass (a thickness of about 3 mm), the encapsulant having a thickness of 500 μm that was prepared as described above, a crystal silicon wafer photovoltaic element, the encapsulant having a thickness of 500 μm that was prepared as described above, and a back sheet (a laminated sheet (PVDF/PET/PVDF) laminated with a polyvinyl fluoride resin sheet having a thickness of 20 μm, polyethylene terephthalate having a thickness of 250 μm, and a polyvinyl fluoride resin sheet having a thickness of 20 μm) were laminated in order and then pressed at 150° C. for 15 minutes and 30 seconds in a vacuum laminator to prepare a solar cell module.

Examples 6 and 7

The encapsulants in a sheet shape and solar cell modules were prepared in the same method as Example 1 except that the resin prepared by preparing 200 g of the master batches of the modified ethylene/α-olefin copolymers which were prepared from Preparation Examples 6 and 7 respectively and 400 g of each of the ethylene/α-olefin copolymers having a density of 0.882 g/cm³ and an MFR of 3 g/10 min of 190° C. and a load of 2.16 kg, and then mixing them in the ratio of 1:2 was used instead of the mixed resin of the ethylene/α-olefin copolymer and the master batch of the modified ethylene/α-olefin copolymer used in Example 1.

Examples 8 and 9

The encapsulants in a sheet shape and solar cell modules were prepared in the same method as Example 1 except that the resin prepared by preparing 200 g of the master batches of the modified ethylene/α-olefin copolymers which were prepared from Preparation Examples 8 and 9 respectively and 400 g of each of the ethylene/α-olefin copolymers having a density of 0.902 g/cm³ and an MFR of 3 g/10 min under a temperature of 190° C. and a load of 2.16 kg, and then mixing them in the ratio of 1:2 was used instead of the mixed resin of the ethylene/α-olefin copolymer and the master batch of the modified ethylene/α-olefin copolymer used in Example 1.

Example 10

The encapsulant in a sheet shape and solar cell module were prepared in the same method as Example 1 except that the resin prepared by preparing 100 g of the master batch of the modified ethylene/α-olefin copolymer which were prepared from Preparation Example 3 and 500 g of the ethylene/

α-olefin copolymer having a density of 0.870 g/cm³ and an MFR of 5 g/10 min under a temperature of 190° C. and a load of 2.16 kg, and then mixing them in a ratio of 1:5 was used instead of the mixed resin of the ethylene/α-olefin copolymer and the master batch of the modified ethylene/α-olefin copolymer used in Example 1.

Example 11

The encapsulant in a sheet shape and solar cell module were prepared in the same method as Example 1 except that the resin prepared by preparing 54.5 g of the master batch of the modified ethylene/α-olefin copolymer which were prepared from Preparation Example 3 and 545.5 g of the ethylene/α-olefin copolymer having a density of 0.870 g/cm³ and an MFR of 5 g/10 min under a temperature of 190° C. and a load of 2.16 kg, and then mixing them in a ratio of 1:10 was used instead of the mixed resin of the ethylene/α-olefin copolymer and the master batch of the modified ethylene/α-olefin copolymer used in Example 1.

Example 12

The encapsulant in a sheet shape and solar cell module were prepared in the same method as Example 1 except that the resin prepared by preparing 200 g of the master batch of the modified ethylene/α-olefin copolymer which were prepared from Preparation Example 10 and 400 g of the ethylene/α-olefin copolymer having a density of 0.870 g/cm³ and an MFR of 3 g/10 min under a temperature of 190° C. and a load of 2.16 kg, and then mixing them in the ratio of 1:2 was used instead of the mixed resin of the ethylene/α-olefin copolymer and the master batch of the modified ethylene/α-olefin copolymer used in Example 1.

Comparative Examples 1 to 3

The encapsulants in a sheet shape and solar cell modules were prepared in the same method as Example 1 except that the master batches of the silane-modified ethylene/α-olefin copolymers prepared from Comparative Preparation Examples 1 to 3 were respectively used instead of the master batch of the modified ethylene/α-olefin copolymer used in Example 1.

Comparative Example 4

The encapsulant in a sheet shape and solar cell module were prepared in the same method as Example 1 except that the resin prepared by preparing 200 g of the master batch of the silane-modified ethylene/α-olefin copolymer which were prepared from Comparative Preparation Example 4 and 400 g of the ethylene/α-olefin copolymer having a density of 0.882 g/cm³ and an MFR of 3 g/10 min under a temperature of 190° C. and a load of 2.16 kg, and then mixing them in the ratio of 1:2 was used instead of the mixed resin of the ethylene/α-olefin copolymer and the master batch of the modified ethylene/α-olefin copolymer used in Example 1.

Comparative Example 5

The encapsulant in a sheet shape and solar cell module were prepared in the same method as Example 1 except that the resin prepared by preparing 200 g of the master batch of the silane-modified ethylene/α-olefin copolymer which were prepared from Comparative Preparation Example 5 and 400 g of the ethylene/α-olefin copolymer having a density of 0.902 g/cm³ and an MFR of 3 g/10 min under a temperature of 190° C. and a load of 2.16 kg, and then mixing them in the ratio of 1:2 was used instead of the mixed resin of the ethylene/α-olefin copolymer and the master batch of the modified ethylene/α-olefin copolymer used in Example 1.

Comparative Examples 6 and 7

The encapsulants in a sheet shape and solar cell modules were prepared in the same method as Example 1 except that the master batches of the ethylene/α-olefin copolymers prepared from Comparative Preparation Examples 6 and 7 were used instead of the master batch of the modified ethylene/α-olefin copolymer used in Example 1.

Comparative Example 8

The encapsulant in a sheet shape and solar cell module were prepared in the same method as Example 1 except that the resin prepared by preparing 200 g of the master batch of the modified ethylene/α-olefin copolymer which were prepared from Comparative Preparation Example 8 and 400 g of the ethylene/α-olefin copolymer having a density of 0.870 g/cm³ and an MFR of 3 g/10 min under a temperature of 190° C. and a load of 2.16 kg, and then mixing them in the ratio of 1:2 was used instead of the mixed resin of the ethylene/α-olefin copolymer and the master batch of the modified ethylene/α-olefin copolymer used in Example 1.

TABLE 2

|  | Base resin (content, density) | | | | Additive |
| --- | --- | --- | --- | --- | --- |
|  | Base resin (content, density) | Content | VTMS (wt %) | Amino silane (wt %) | Amino silane content (based on total silane) | master batch (content) |
| Example 1 | 400 g (d = 0.870) | 200 g | 4.79 wt % | APTMS 0.1 wt % | 2 wt % | 18 g |
| Example 2 | 400 g (d = 0.870) | 200 g | 4.65 wt % | APTMS 0.24 wt % | 5 wt % | 18 g |
| Example 3 | 400 g (d = 0.870) | 200 g | 4.40 wt % | APTMS 0.49 wt % | 10 wt % | 18 g |
| Example 4 | 400 g (d = 0.870) | 200 g | 4.40 wt % | APTES 0.49 wt % | 10 wt % | 18 g |
| Example 5 | 400 g (d = 0.870) | 200 g | 4.40 wt % | DAS 0.49 wt % | 10 wt % | 18 g |
| Example 6 | 400 g (d = 0.882) | 200 g | 4.79 wt % | APTMS 0.1 wt % | 2 wt % | 18 g |
| Example 7 | 400 g (d = 0.882) | 200 g | 4.40 wt % | APTMS 0.49 wt % | 10 wt % | 18 g |

TABLE 2-continued

| | Base resin (content, density) | | | | Additive |
|---|---|---|---|---|---|
| | Base resin (content, density) | Content | VTMS (wt %) | Amino silane (wt %) | Amino silane content (based on total silane) | master batch (content) |
| Example 8 | 400 g (d = 0.902) | 200 g | 4.79 wt % | APTMS 0.1 wt % | 2 wt % | 18 g |
| Example 9 | 400 g (d = 0.902) | 200 g | 4.40 wt % | APTMS 0.49 wt % | 10 wt % | 18 g |
| Example 10 | 500 g (d = 0.870) | 100 g | 4.40 wt % | APTMS 0.49 wt % | 10 wt % | 18 g |
| Example 11 | 545.5 g (d = 0.870) | 54.5 g | 4.40 wt % | APTMS 0.49 wt % | 10 wt % | 18 g |
| Example 12 | 400 g (d = 0.870) | 200 g | 3.67 wt % | APTMS 1.22 wt % | 25 wt % | 18 g |
| Comparative Example 1 | 400 g (d = 0.870) | 200 g | 4.89 wt % | — | — | 18 g |
| Comparative Example 2 | 400 g (d = 0.870) | 200 g | 4.40 wt % | DA 0.49 wt % | — | 18 g |
| Comparative Example 3 | 400 g (d = 0.870) | 200 g | 4.40 wt % | TMS 0.49 wt % | — | 18 g |
| Comparative Example 4 | 400 g (d = 0.882) | 200 g | 4.89 wt % | — | — | 18 g |
| Comparative Example 5 | 400 g (d = 0.902) | 200 g | 4.89 wt % | — | — | 18 g |
| Comparative Example 6 | 400 g (d = 0.870) | 200 g | — | APTMS 4.89 wt % | 100 wt % | 18 g |
| Comparative Example 7 | 400 g (d = 0.870) | 200 g | — | APTMS 0.49 wt % | 100 wt % | 18 g |
| Comparative Example 8 | 400 g (d = 0.870) | 200 g | 2.44 wt % | APTMS 2.45 wt % | 50 wt % | 18 g |

Experimental Example

1. Measurement of 90° Peel Strength

In order to measure the peel strengths of the encapsulants prepared from Examples 1 to 12 and Comparative Examples 1 to 8, specimens that were similar to the manufactured solar cell module were separately manufactured. The specimens were manufactured by laminating a plate glass (a thickness of about 3 mm), the encapsulant having a thickness of 500 μm that was prepared as described above, and a back sheet (a laminated sheet (PVDF/PET/PVDF) laminated with a polyvinyl fluoride resin sheet having a thickness of 20 μm, polyethylene terephthalate having a thickness of 250 μm, and a polyvinyl fluoride resin sheet having a thickness of 20 μm) in order and then performing the lamination at 150° C. for 15 minutes and 30 seconds in a vacuum laminator. After fixing the bottom glass plate of the specimens thus manufactured, based on ASTM D1897, peel strengths were measured by performing the peeling of the encapsulant adhered only to the back sheet at a width rectangle of 15 mm, a tension speed of 50 mm/min, and a peel angle of 90° along with the back sheet at the same time. As a result, the peel strengths thus measured are listed in the following Table 3.

TABLE 3

| | Base resin (Content, density) | | | | |
|---|---|---|---|---|---|---|
| | Base resin (Content, density) | Content | VTMS (wt %) | Amino silane (wt %) | Amino silane content (based on total silane) | 90° peel strength (N/15 mm) |
| Example 1 | 400 g (d = 0.870) | 200 g | 4.79 wt % | APTMS 0.1 wt % | 2 wt % | 176.1 |
| Example 2 | 400 g (d = 0.870) | 200 g | 4.65 wt % | APTMS 0.24 wt % | 5 wt % | 273.3 |
| Example 3 | 400 g (d = 0.870) | 200 g | 4.40 wt % | APTMS 0.49 wt % | 10 wt % | 300.0 |
| Example 4 | 400 g (d = 0.870) | 200 g | 4.40 wt % | APTES 0.49 wt % | 10 wt % | 309.3 |
| Example 5 | 400 g (d = 0.870) | 200 g | 4.40 wt % | DAS 0.49 wt % | 10 wt % | 205.3 |
| Example 6 | 400 g (d = 0.882) | 200 g | 4.79 wt % | APTMS 0.1 wt % | 2 wt % | 369.7 |
| Example 7 | 400 g (d = 0.882) | 200 g | 4.40 wt % | APTMS 0.49 wt % | 10 wt % | 302.7 |
| Example 8 | 400 g (d = 0.902) | 200 g | 4.79 wt % | APTMS 0.1 wt % | 2 wt % | 180.0 |
| Example 9 | 400 g (d = 0.902) | 200 g | 4.40 wt % | APTMS 0.49 wt % | 10 wt % | 350.7 |
| Example 10 | 500 g (d = 0.870) | 100 g | 4.40 wt % | APTMS 0.49 wt % | 10 wt % | 228.7 |

TABLE 3-continued

| | Base resin (Content, density) | Content | VTMS (wt %) | Amino silane (wt %) | Amino silane content (based on total silane) | 90° peel strength (N/15 mm) |
|---|---|---|---|---|---|---|
| Example 11 | 545.5 g (d = 0.870) | 54.5 g | 4.40 wt % | APTMS 0.49 wt % | 10 wt % | 170.0 |
| Example 12 | 400 g (d = 0.870) | 200 g | 3.67 wt % | APTMS 1.22 wt % | 25 wt % | 208.3 |
| Comparative Example 1 | 400 g (d = 0.870) | 200 g | 4.89 wt % | — | — | 77.0 |
| Comparative Example 2 | 400 g (d = 0.870) | 200 g | 4.40 wt % | DA 0.49 wt % | — | 132.1 |
| Comparative Example 3 | 400 g (d = 0.870) | 200 g | 4.40 wt % | TMS 0.49 wt % | — | 67.6 |
| Comparative Example 4 | 400 g (d = 0.882) | 200 g | 4.89 wt % | — | — | 97.5 |
| Comparative Example 5 | 400 g (d = 0.902) | 200 g | 4.89 wt % | — | — | 78.0 |
| Comparative Example 6 | 400 g (d = 0.870) | 200 g | — | APTMS 4.89 wt % | 100 wt % | 73.4 |
| Comparative Example 7 | 400 g (d = 0.870) | 200 g | — | APTMS 0.49 wt % | 100 wt % | 68.0 |
| Comparative Example 8 | 400 g (d = 0.870) | 200 g | 2.44 wt % | APTMS 2.45 wt % | 50 wt % | 162.4 |

The average adhesive strengths according to the content range of APS are listed in the following Table 4.

TABLE 4

| | Silane master batch | | | | | |
|---|---|---|---|---|---|---|
| | VTMS 100 wt % | APS 2 wt % | APS 5 wt % | APS 10 wt % | APS 25 wt % | APS 50 wt % |
| Average adhesive strength (N/15 mm) | 79.9 | 211.5 | 264.3 | 287.0 | 208.3 | 162.4 |
| Peel trend | EN/BS | EN/GL | EN/GL | EN/GL | EN/GL | EN/GL |

EN: Encapsulant
GL: Plate glass
BS: Back sheet
EN/GL: Peeling between encapsulant and plate glass
EN/BS: Peeling between encapsulant and back sheet
EN/GL + BS: Peeling between encapsulant, and plate glass and back sheet As listed in the above-described Table 3, it can be confirmed that the adhesive strength of the encapsulant in a sheet shape, which is prepared by using the master batch of the modified ethylene/α-olefin copolymer prepared by using both of vinyltrimethoxysilane and amino silane is excellent as compared with the encapsulant sheets prepared from Comparative Examples 1, and 3 to 7, which are prepared by using only one of vinyltrimethoxysilane, alkyl silane, and amino silane. In addition, it can be confirmed that when the content ratio of the master batch of the modified ethylene/α-olefin copolymer and non-modified ethylene/α-olefin copolymer is 1:2, the adhesive strength is most excellent. In the case of Comparative Example 2 using alkyl amine alone, the initial peel strength can reach a certain level or more, but long-term durability is decreased due to the alkyl amine remained in a system, and thereby, the peel strength measured after being left under severe conditions is more likely to be significantly reduced.

In addition, as listed in Table 4, it can be confirmed that when the content of the amino silane compound in the olefin resin composition is in the range of 2 to 25 wt %, an average adhesive strength is about 200 N/15 mm or more, and thus, the adhesive strength is very excellent.

In other words, from Examples 1 to 12, Comparative Examples 1 to 8, and Experimental Examples about them, it can be confirmed that when the specific content ranges of the master batch of the ethylene/α-olefin copolymer modified by using all of the vinyl silane and amino silane and non-modified ethylene/α-olefin copolymer are used, as compared with the case of singly using vinyl silane, alkyl amine, amino silane, or alkyl silane, the adhesive strengths of the glass substrate of the bottom of the encapsulant and back sheet of the top of the encapsulant are excellent.

2. Measurement of Peel Strength at 90° while Varying Lamination Conditions

Figure 3:
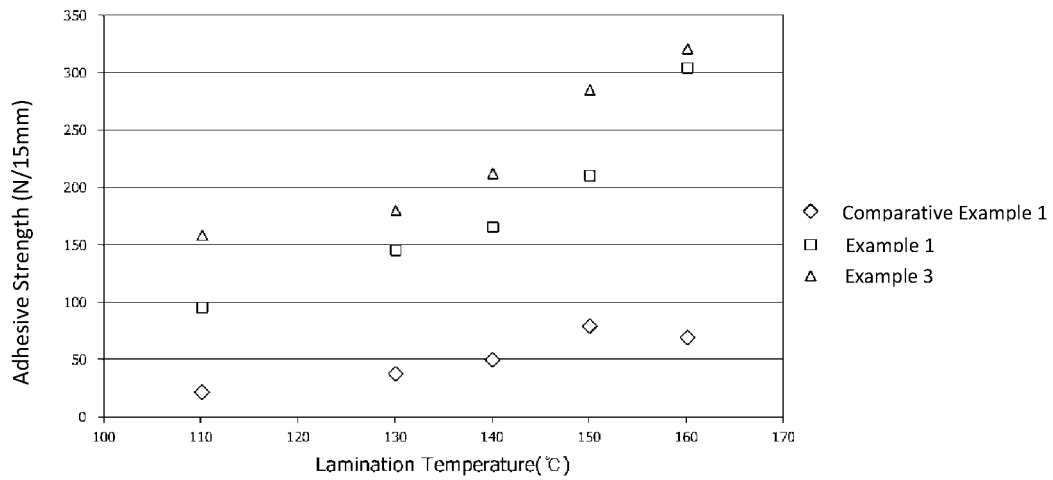
FIG. 3 is a graph illustrating adhesive strengths of the encapsulants according to Examples and Comparative Examples of the present application to a glass substrate according to lamination temperatures.

The peel strengths at 900 were measured in the same method as Experimental Example 1 except that the specimens that were similar to the solar cell modules manufactured using the encapsulants of Examples 1 and 3 were manufactured in Experimental Example 1 under the lamination conditions as listed in the following Table 5, that is, at 110° C., 130° C., 140° C., 150° C., and 160° C. for 6 minutes and 30 seconds, 10 minutes and 30 seconds, and 15 minutes and 30 seconds, respectively. The results thus measured are listed in the following Table 5, and the graph exhibiting adhesive strengths according to the lamination temperatures is illustrated in FIG. 3.

In addition, the peel strengths at 900 were measured in the same method as Experimental Example 1 except that the specimen that was similar to the solar cell module manufactured using the encapsulant of Comparative Example 1 was manufactured in Experimental Example 1 under the lamination conditions as listed in the following Table 5, that is, at 110° C., 130° C., 140° C., 150° C., and 160° C. for 6 minutes and 30 seconds, 10 minutes and 30 seconds, and 15 minutes and 30 seconds, respectively. The results thus measured are listed in the following Table 5, and the graph exhibiting adhesive strengths according to the lamination temperatures is illustrated in FIG. 3.

TABLE 5

| Lamination condition | | 90° Peel Strengths (N/15 mm) | | |
|---|---|---|---|---|
| | | 2 min vacuum/ 30 sec press/ 4 min retain pressure | 3 min vacuum/ 30 sec press/ 7 min retain pressure | 5 min vacuum/ 30 sec press/ 10 min retain pressure |
| Comparative Example 1 | 110° C. | 9.0 | 8.5 | 22.5 |
| | 130° C. | 17.8 | 25.6 | 39.0 |
| | 140° C. | 22.5 | 38.3 | 50.4 |
| | 150° C. | 34.2 | 62.0 | 79.9 |
| | 160° C. | 67.5 | 67.9 | 70.0 |
| Example 1 | 110° C. | 63.0 | 86.4 | 96.3 |
| | 130° C. | 64.9 | 115.8 | 145.6 |
| | 140° C. | 99.0 | 153.7 | 167.8 |
| | 150° C. | 126.8 | 186.5 | 211.5 |
| | 160° C. | 184.8 | 246.9 | 305.0 |
| Example 3 | 110° C. | 106.3 | 139.9 | 159.7 |
| | 130° C. | 176.0 | 213.7 | 181.9 |
| | 140° C. | 205.5 | 294.3 | 214.0 |
| | 150° C. | 326.7 | 296.3 | 287.0 |
| | 160° C. | 324.7 | 336.0 | 323.0 |

As listed in the above-described Table 5, in can be confirmed that in the cases of Examples 1 and 3 using amino silane and vinyltrimethoxysilane at the same time as compared with Comparative Example 1 using only vinyltrimethoxysilane, excellent adhesive strengths are exhibited under various lamination temperatures and times, and also in the case of laminating at a low lamination temperature, that is, 110° C., excellent adhesive strength of 50 N/15 mm or more is exhibited.

3. Measurement of Yellowness Index

For the encapsulant films for an optoelectronic device manufactured in Examples and Comparative Examples, the reflexibilities were measured at the region of 400 nm to 700 nm using Colorflex (Hunter lab) based on ASTM 1925, and then, using them, YI (Yellowness index) values were obtained (see the following Equation 2).

$$YI = [100(1.28 X_{CIE} - 1.06 Z_{CIE})]/Y_{CIE} \quad \text{[Equation 2]}$$

The YI is a value calculated by using a chrominance analysis program of a UV/VIS/NIR spectrometer (ASTM, D1925), and the $X_{CIE}$, $Y_{CIE}$, and $Z_{CIE}$ are relative values represented by red, green, and blue color coordinates, respectively.

YI values according to the content ranges of APS are listed in the following Table 6.

TABLE 6

| | Silane master batch | | | | |
|---|---|---|---|---|---|
| | VTMS 100 wt % | APS 2 wt % | APS 5 wt % | APS 10 wt % | APS 25 wt % | APS 50 wt % |
| YI value | 0.98 | 1.23 | 1.25 | 1.43 | 2.49 | 2.7 |

As can be seen in the above-described Table 6, when the content of the amino silane compound is too much in the silane compound of the whole silane master batch, the YI value is increased.

4. IR Analysis

In order to detect a branched chain including a moiety, in which hydrocarbon groups of some silyl groups are converted into hydroxyl groups, and also a moiety having an amine functional group in the modified master batch, and to measure the degree of converting a methoxysilyl group (Si—O—CH$_3$) into a silanol group (Si—OH) by promoting the hydrolysis by an amino silane compound during the lamination process of the encapsulant film, for the modified master batches of Preparation Examples 1 to 3 and Comparative Preparation Example 1 and the encapsulant films manufactured in Examples 1 to 3 and Comparative Example 1, each of the peak areas of the methylene group (CH$_2$), silanol group (Si—OH), and amine group (NH$_2$) in the modified master batches and encapsulants was measured. The respective peak areas were measured by using the following method and conditions.

With an attenuated total reflection (ATR) mode using a Varian 660-IR, diamond/ZnSe, and the modified master batch and encapsulant specimens were adhered to each other, incident light of 45° on the side of the diamond/ZnSe was irradiated, infrared light absorption rates of the regions of the wave number of 600 cm$^{-1}$ to 4000 cm$^{-1}$ were measured, and then, using them, the area of each of the peaks was measured. At this time, the peak value was calculated by using an average value of 32 time reflections. The peak areas of the silanol group (Si—OH) and amino group (NH$_2$) were obtained by integrating the peak area of the wave number of 3100 cm$^{-1}$ to 3600 cm$^{-1}$ using the wave number of 2400 cm$^{-1}$ to 3800 cm$^{-1}$ as a base line. The peak area of the methylene group (CH$_2$) was obtained by integrating the peak area of the wave number of 705 cm$^{-1}$ to 735 cm$^{-1}$ using the wave number of 690 cm$^{-1}$ to 760 cm$^{-1}$ as a base line.

<Measurement Condition>
Number of irradiation: 32
Resolving power: 4

Figure 4:
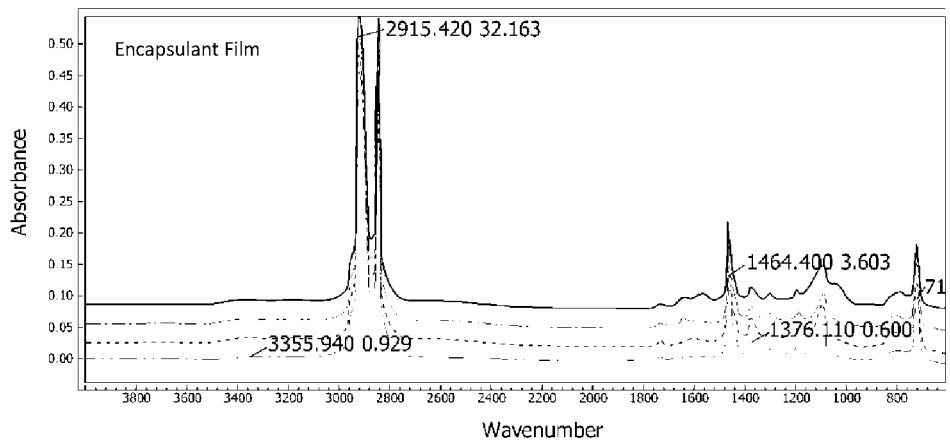
FIG. 4 is a graph illustrating results of FT-IR measuring of the encapsulants according to Examples and Comparative Examples of the present application.
Figure 5:
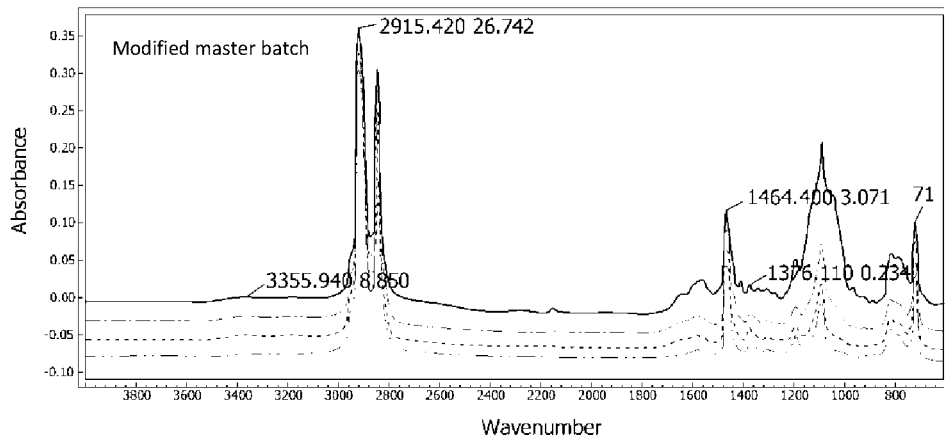
FIG. 5 is a graph illustrating results of FT-IR measuring of the modified olefin resins according to Preparation Examples and Comparative Preparation Examples of the present application.

A measuring result for an encapsulant film is illustrated in the following Table 7 and FIG. 4, and a measuring result for a modified master batch is illustrated in Table 8 and FIG. 5.

TABLE 7

| Sample | APS content | Si—OH & NH$_2$ peak area (S$_a$) | CH$_2$ peak area (S$_m$) | Ratio of area (S$_a$/S$_m$) |
|---|---|---|---|---|
| Example 1 | 2 wt % | 1.44 | 1.61 | 0.90 |
| Example 2 | 5 wt % | 2.00 | 1.58 | 1.26 |
| Example 3 | 10 wt % | 3.04 | 1.51 | 2.00 |
| Comparative Example 1 | VTMS 100% | 0.93 | 1.62 | 0.57 |

TABLE 8

| Sample | APS content | Si—OH & NH$_2$ peak area (S$_a$) | CH$_2$ peak area (S$_m$) | Ratio of area (S$_a$/S$_m$) |
|---|---|---|---|---|
| Preparation Example 1 | 2 wt % | 4.55 | 1.58 | 2.89 |
| Preparation Example 2 | 5 wt % | 7.80 | 1.48 | 5.27 |
| Preparation Example 3 | 10 wt % | 8.85 | 1.12 | 7.90 |
| Comparative Preparation Example 1 | VTMS 100% | 1.70 | 1.64 | 1.04 |

5. Measurement of Light Transmittance

In order to measure light transmittance of the encapsulants manufactured from Example 3 and Comparative Example 1, special specimens were separately manufactured. The specimens were manufactured by inserting two sheets of overlapped encapsulants having a thickness of 500 μm manufactured as described above between two slide glasses (a thickness of about 1 mm) for an optical microscope, and then laminating them at various lamination temperature conditions as listed in the following Table 9 in a vacuum laminator to have the sum thickness of two overlapped encapsulants of about 500±50 μm using a guide. The total light transmittances and haze values of the specimens to the light of wavelength of 550 nm were measured using a hazemeter, and then the results thus obtained are listed in the following Table 9. In this case, the specimens were added to a specimen holder and then the transmittances and haze values were measured three times, and then, the average value was calculated from three values thus obtained. The transmittances and haze values were measured under the standard condition of JIS K 7105. The lamination process time was fixed to be 5 min vacuum/30 sec press/10 min retain pressure.

<UV/Vis Spectroscopy Apparatus Measuring Conditions>
Slit width: 32 nm
Detector unit: External (2D detectors)
Time constant: 0.2 sec

TABLE 9

|  | Lamination condition | 5 min vacuum/30 sec press/10 min retain pressure | | |
| --- | --- | --- | --- | --- |
|  | Temperature | Tt (%) | Td (%) | Haze (%) |
| Comparative Example 1 | 110° C. | 92.1 | 0.6 | 0.7 |
|  | 130° C. | 91.5 | 2.4 | 2.6 |
|  | 150° C. | 91.4 | 2.8 | 3.1 |
| Example 3 | 110° C. | 92.2 | 0.6 | 0.7 |
|  | 130° C. | 91.3 | 2.8 | 3.1 |
|  | 150° C. | 91.5 | 2.9 | 3.2 |

Figure 6:
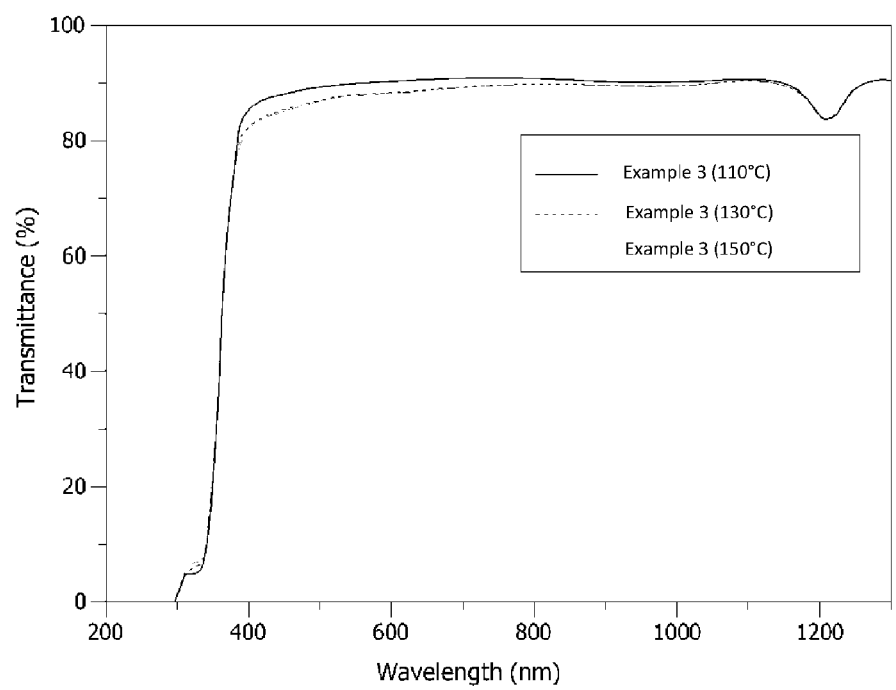
FIG. 6 is a graph illustrating a UV/Vis spectroscopy of the sample prepared from Example 3 of the present application.
Figure 7:
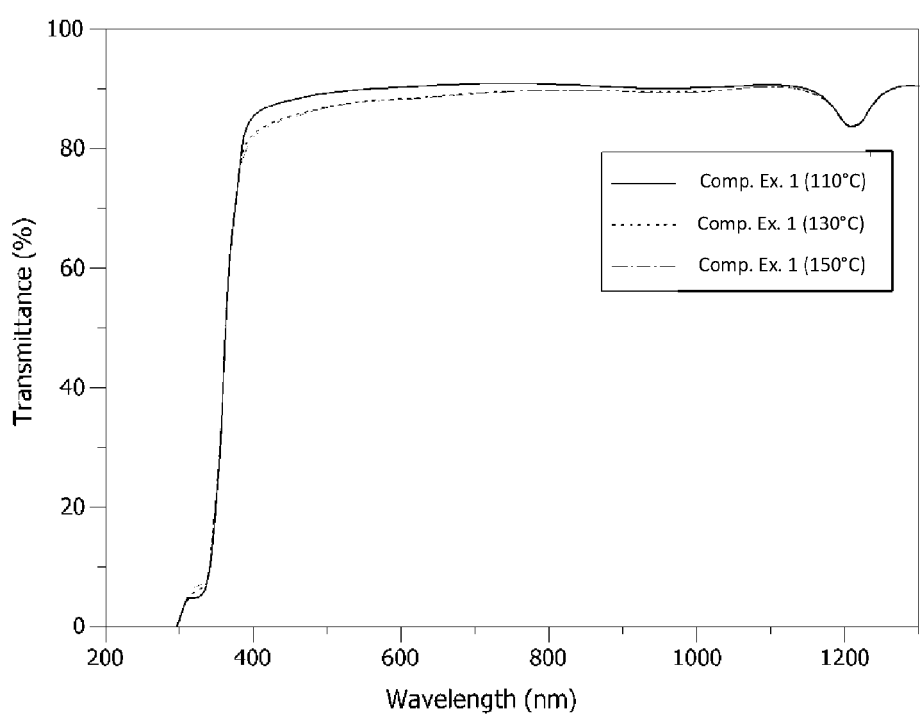
FIG. 7 is a graph illustrating a UV/Vis spectroscopy of the sample prepared from Comparative Example 1 of the present application.

As can be seen in the above-described Table 9 and FIGS. 6 and 7, regardless of whether or not amino silane is added, the samples laminated at a low temperature, that is, 110° C. exhibit low haze value and high total light transmittance.

In the case of Comparative Example 1 using vinyltrimethoxysilane alone, it is difficult to use it as a sunlight encapsulant due to low adhesive strength at a lamination process temperature of 110° C., but in the case of Example 3 adding amino silane to the vinyltrimethoxysilane, it can be confirmed that high adhesive strength and also high light transmittance are exhibited even at a low lamination temperature.

The invention claimed is:

1. An olefin resin composition comprising an olefin resin, an unsaturated silane compound, an amino silane compound, and a radical initiator, wherein the amino silane compound is included in an amount of 1 to 40 parts by weight with respect to 100 parts by weight of the silane compound in the whole olefin resin composition.

2. The olefin resin composition of claim 1, wherein the unsaturated silane compound is represented by the following Chemical Formula 1:

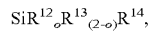  [Chemical Formula 1]

in the Chemical Formula 1,
D represents alkenyl being bound to a silicon atom;
$R^1$ represents a hydroxyl group, halogen, an amine group, or —$R^3R^4$, being bound to a silicon atom;
$R^3$ represents oxygen or a sulfur atom;
$R^4$ represents an alkyl group, an aryl group, or acyl group;
$R^2$ represents hydrogen, an alkyl group, an aryl group, or an aralkyl group, being bound to a silicon atom; and
l is an integer of 1 to 3.

3. The olefin resin composition of claim 1, wherein the unsaturated silane compound is vinyl alkoxy silane.

4. The olefin resin composition of claim 1, wherein the amino silane compound is represented by the following Chemical Formula 2:

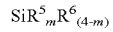  [Chemical Formula 2]

in the Chemical Formula 2,
$R^5$ represents —$(CH_2)$—$NR^7R^8$ being bound to a silicon atom;
$R^7$ and $R^8$ each independently represent hydrogen or $R^9NH_2$, being bound to a nitrogen atom;
$R^9$ represents alkylene;
$R^6$ represents halogen, an amine group, —$R^{10}R^{11}$, or —$R^{11}$, being bound to a silicon atom;
$R^{10}$ represents oxygen or a sulfur atom;
$R^{11}$ represents hydrogen, an alkyl group, an aryl group, an aralkyl group, or an acyl group;
m is an integer of 1 to 4; and
n is an integer of 0 or more.

5. The olefin resin composition of claim 1, wherein the olefin resin includes ethylene/α-olefin copolymer.

6. The olefin resin composition of claim 5, wherein the ethylene/α-olefin copolymer has a density of 0.85 g/cm³ to 0.96 g/cm³.

7. The olefin resin composition of claim 5, wherein MFR of the ethylene/α-olefin copolymer is 1.0 g/10 min to 50.0 g/10 min under a temperature of 190° C. and a load of 2.16 kg.

8. The olefin resin composition of claim 1, wherein the radical initiator is one or two or more selected from the group consisting of organic peroxide, hydroperoxide, and an azo compound.

9. The olefin resin composition of claim 1, wherein the radical initiator is included in an amount of 0.001 to 5 parts by weight with respect to 100 parts by weight of a solid content in the whole olefin resin composition.

10. The olefin resin composition of claim 1, further comprising at least one additive selected from the group consisting of photostabilizer, a UV absorbent, and a thermal stabilizer.

11. A method of manufacturing an encapsulant for an optoelectronic device, the method comprising preparing a modified olefin resin by extrusion-reacting the olefin resin composition of claim 1.

12. The method of claim 11, further comprising further adding a non-modified olefin resin to the modified olefin resin and then molding in a film or sheet shape.

13. The method of claim 12, wherein the preparing of the modified olefin resin and molding in a film or sheet shape are performed in an in-situ process.

14. The olefin resin composition of claim 1, wherein the olefin resin composition includes a branched chain, which is bound to a main chain and is represented by the following Chemical Formula 3:

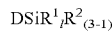,  [Chemical Formula 3]

wherein in $R^{12}$ and $R^{13}$ each independently represent halogen, an amine group, —$R^{15}R^{16}$, or —$R^{16}$ being ing bound to a silicon atom;
wherein $R^{15}$ represents oxygen or a sulfur atom;
wherein $R^{16}$ represents hydrogen, an alkyl group, an aryl group, an aralkyl group, or an acyl group, and o is an integer of 1 or 2;
wherein $R^{14}$ represents —$OSiR^{17}_pR^{18}_{(2-p)}R^{19}$ being bound to a silicon atom;

wherein $R^{17}$ and $R^{18}$ each independently represent halogen, an amine group, —$R^{20}R^{21}$, or $R^{21}$ being bound to a silicon atom;

wherein $R^{20}$ represents oxygen or a sulfur atom;

wherein $R^{21}$ represents hydrogen, an alkyl group, an aryl group, an aralkyl group, or acyl group;

wherein $R^{19}$ represents —$(CH_2)_q NR^{22}R^{23}$ being bound to a silicon atom;

wherein $R^{22}$ and $R^{23}$ each independently represent hydrogen or $R^{24}NH_2$ being bound to a nitrogen atom;

wherein $R^{24}$ represents alkylene; and wherein the p is an integer of 1 or 2, and q is an integer of 0 or more.

* * * * *